(12) United States Patent
Tarutani et al.

(10) Patent No.: US 7,425,404 B2
(45) Date of Patent: Sep. 16, 2008

(54) CHEMICAL AMPLIFICATION RESIST COMPOSITION AND PATTERN-FORMING METHOD USING THE SAME

(75) Inventors: Shinji Tarutani, Shizuoka (JP); Hyou Takahashi, Shizuoka (JP); Kenji Wada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 215 days.

(21) Appl. No.: 11/206,220

(22) Filed: Aug. 18, 2005

(65) Prior Publication Data

US 2006/0040208 A1 Feb. 23, 2006

(30) Foreign Application Priority Data

Aug. 18, 2004 (JP) .......................... P.2004-238040

(51) Int. Cl.
*G03F 7/039* (2006.01)
*G03F 7/038* (2006.01)

(52) U.S. Cl. .................. 430/287.1; 430/270.1; 430/326

(58) Field of Classification Search ........................ None
See application file for complete search history.

(56) References Cited

U.S. PATENT DOCUMENTS

| | | | | |
|---|---|---|---|---|
| 5,360,692 A | * | 11/1994 | Kawabe et al. | 430/191 |
| 5,405,720 A | * | 4/1995 | Hosaka et al. | 430/191 |
| 5,529,881 A | * | 6/1996 | Kawabe et al. | 430/191 |
| 5,824,451 A | * | 10/1998 | Aoai et al. | 430/270.1 |
| 5,849,461 A | | 12/1998 | Hatakeyama | |
| 2003/0099901 A1 | | 5/2003 | Hatakeyama et al. | |
| 2004/0053161 A1 | | 3/2004 | Kanna et al. | |

FOREIGN PATENT DOCUMENTS

| | | |
|---|---|---|
| EP | 0 445 058 A1 | 9/1991 |
| EP | 1 275 666 A1 * | 1/2003 |
| EP | 1 505 440 A2 | 2/2005 |
| JP | 4-217251 A | 8/1992 |
| JP | 9-185158 A | 7/1997 |
| JP | 2003-156845 A | 5/2003 |
| JP | 2003-270791 A | 9/2003 |
| JP | 2003-287890 A * | 10/2003 |
| WO | WO 02/31595 A2 | 4/2002 |

OTHER PUBLICATIONS

English translation of JP, 2003-287890, A (2003) from machine translation from AIPN Japan Patent Office Natinal center for Industrial Property Information and Training, generated Jul. 10, 2007, 17 pages.*
Ferreira et al "Choice of amines as stabilizers for chemically amplifted resist systems", Proceedings of SPIE, vol. 333, Advances in Resist Technology and Processing XV, WIII Conely, Ed, Jun. 1998, pp. 236-244.*
Hamad et al, "Fluorinated dissolution inhibiotrs for 157 nm lithography", Proceedings of SPIE vol. 4690, Advances in Resist TEchnology and Processing XIX, Fedynyshyn, ed, Jul. 2002, pp. 477-485.*
Extended European Search Report dated Mar. 19, 2008.

* cited by examiner

*Primary Examiner*—Cynthia Hamilton
(74) *Attorney, Agent, or Firm*—Sughrue Mion, PLLC

(57) ABSTRACT

A chemical amplification resist composition comprising (A) a resin increasing the solubility in an alkali developer by the action of an acid, (B) a compound capable of generating an acid upon irradiation with actinic ray or radiation, (C) a compound having a fluorine atom and a hydroxyl group, and a pKa value of from 4 to 15, and (D) a solvent, and a pattern-forming method using the same.

8 Claims, No Drawings

CHEMICAL AMPLIFICATION RESIST COMPOSITION AND PATTERN-FORMING METHOD USING THE SAME

BACKGROUND OF THE INVENTION

1. Field of the Invention

The present invention relates to a chemical amplification resist composition for use in manufacturing processes of semiconductor devices, such as lithographic printing plate and IC, manufacture of circuit substrates of liquid crystals, thermal heads and the like, and other photo-fabrication processes, and also the invention relates to a pattern-forming process using the same. In particular, the invention relates to a chemical amplification resist composition that functions by high energy radiation such as far ultraviolet rays (including excimer lasers), electron beams, X-rays or radiant rays, suitable for the manufacture of a semiconductor integrated circuit, and the invention also relates to a pattern-forming process using the same.

2. Background Art

In the manufacturing process of semiconductor devices such as IC and LSI, fine processing by lithography using photo-resist compositions has been conventionally performed. In recent years, with the increment of integration of integrated circuits, ultrafine pattern formation of the level of a sub-micron and quarter-micron has come to be required. Under such a circumstance, the exposure wavelengths show a tendency to be shortening, such as from g-ray to i-ray, further to KrF excimer laser ray. Nowadays, lithography using excimer laser rays is an important processing technique in this field, and chemical amplification resists are adopted as the resists suitable for such an excimer laser lithography process.

Chemical amplification resist compositions are materials that form a pattern on a substrate by generating an acid upon irradiation with radiation such as far ultraviolet rays on the exposed area, and making difference in solubility in a developing solution of the exposed area and unexposed area with the actinic radiation. Chemical amplification resist compositions are advantageous in that they have high sensitivity and high resolution, and they can form an image with a compound capable of generating an acid (hereinafter referred to as "a photo-acid generator") by irradiation with a small quantity of radiation.

The above chemical amplification resist compositions can be classified broadly into (a) s three-component system comprising an alkali-soluble resin, a photo-acid generator, and a compound having an acid-decomposable group that inhibits dissolution of an alkali-soluble resin, (b) a two-component system comprising a resin having a group decomposable by the reaction with an acid and becoming alkali-soluble, and a photo-acid generator, and (c) a hybrid system comprising a resin having a group decomposable by the reaction with an acid and becoming alkali-soluble, a low molecular weight dissolution-inhibiting compound having an acid-decomposable group, and a photo-acid generator. In every positive chemical amplification resist of these two-component system, three-component system and hybrid system, a resist pattern is formed by the development after heat treatment via an acid generated from photo-acid generator upon exposure.

In lithography using chemical amplification resists, photoresists are generally required to be excellent in various characteristics, e.g., sensitivity, resolution, profile, a coating property, heat resistance, dry etching resistance, adhesion, substrate dependency, stability resisting to environmental fluctuations (e.g., dimensional stability of a resist due to the fluctuation of lying time), and focal depth (e.g., a pattern-forming property to focal deviation at the time of irradiation with radiation), and various contrivances of the improvement of performances by means of additives are disclosed.

For example, the addition of an aromatic hydroxyl compound to a chemical amplification resist composition for the increment of sensitivity is disclosed in patent literature 1 (JP-A-4-217251 (the term "JP-A" as used herein refers to an "unexamined published Japanese patent application").

A trial of the addition of a compound having a fluorine atom in the molecule to a chemical amplification resist composition for the purpose of lessening the problem of development defect is disclosed in patent literature 2 (JP-A-2003-156845).

The addition of a specific alcohol to a chemical amplification resist composition for the improvement of the reproducibility and stability of a pattern is disclosed in patent literature 3 (JP-A-9-185158).

Further, the addition of a chain-like compound having three or more hydroxyl groups or substituted hydroxyl groups to a chemical amplification resist composition for the improvement of line edge roughness to thereby prevent the collapse of a pattern is disclosed in patent literature 4 (JP-A-2003-270791).

However, even with these techniques, it is difficult to obtain a chemical amplification resist composition that satisfies at the same time the three points of capable of forming a good pattern profile, being hardly accompanied by development defect and capable of preventing pattern collapse.

SUMMARY OF THE INVENTION

An object of the invention is to provide a chemical amplification resist composition that is improved in development defect, capable of forming an excellent resist pattern profile, and capable of preventing pattern collapse, and also relates to a pattern-forming method using the same.

As a result of eager examination of the constitutional materials of chemical amplification resist composition by the present inventors, it was found that the above objects can be attained with a compound containing a specific fluorine atom, thus the invention was accomplished. That is, the above objects can be achieved by the following constitution.

1. A chemical amplification resist composition comprising: (A) a resin increasing the solubility in an alkali developer by the action of an acid; (B) a compound capable of generating an acid upon irradiation with actinic ray or radiation; (C) a compound having a fluorine atom and a hydroxyl group, and a pKa value of from 4 to 15; and (D) a solvent.

2. The chemical amplification resist composition as described in the item 1, wherein the compound (C) includes (Ca) a compound represented by the following formula (FAD-I), (FAD-II) or (FAD-III):

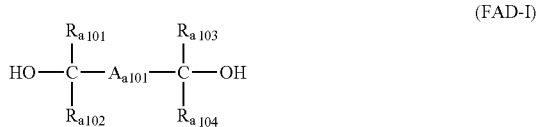

(FAD-I)

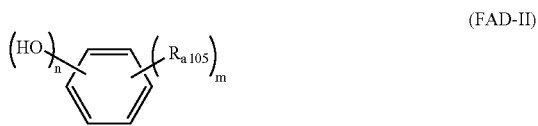

(FAD-II)

-continued

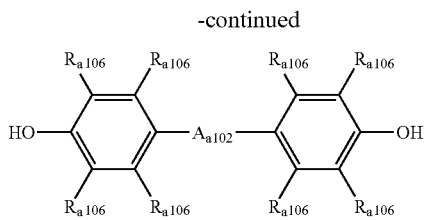
(FAD-III)

wherein $R_{a101}$, $R_{a102}$, $R_{a103}$ and $R_{a104}$ each represents a hydrogen atom, an alkyl group, an alicyclic alkyl group, an alkoxyl group, an acyl group or an acyloxy group;

$A_{a101}$, represents a perfluoroalkylene group or a perfluorocycloalkylene group;

$R_{a105}$ represents a fluorine atom or a perfluoroalkyl group, in which a plurality of $R_{a105}$ each may be the same or different;

n represents 1 or 2, and n+m=6;

$A_{a102}$ represents a single bond or a divalent organic group; and $R_{a106}$ represents a fluorine atom or a perfluoroalkyl group, in which a plurality of $R_{a106}$ each may be the same or different.

3. The chemical amplification resist composition as described in the item 2, wherein the compound (Ca) is a compound represented by the following formula (FAD-Ia):

HO—CH$_2$-A$_{a101}$-CH$_2$—OH    (FAD-Ia)

wherein $A_{a101}$ represents a perfluoroalkylene group or a perfluorocycloalkylene group.

4. The chemical amplification resist composition as described in the item 1 or 2, wherein the content of the component (C) in the solids content of the chemical amplification resist composition is from 0.1 to 10 mass %.

5. The chemical amplification resist composition as described in any one of the items 1 to 4, wherein the resin (A) has at least one repeating unit selected from the group consisting of a repeating unit having a partial structure containing alicyclic hydrocarbon represented by the following formula (pI), (pII), (pIII), (pIV), (pV) or (pVI), and a repeating unit represented by the following formula (II-AB):

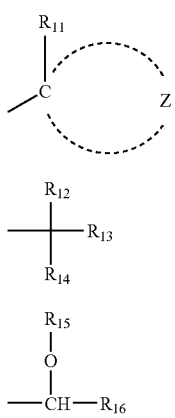

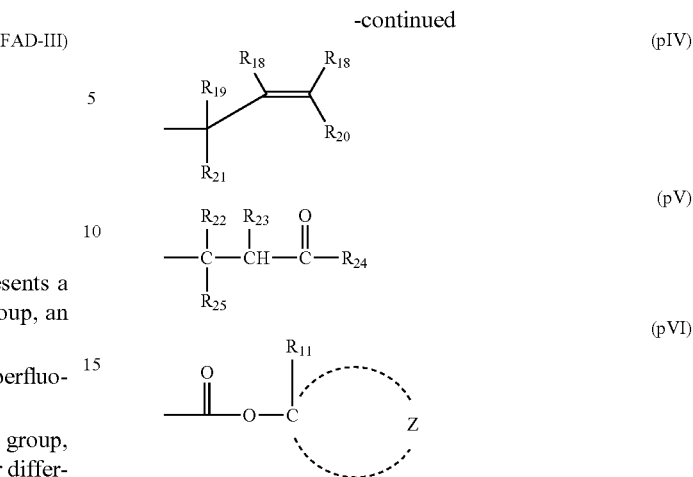

wherein $R_{11}$ represents an alkyl group; Z represents an atomic group necessary to form an alicyclic hydrocarbon group together with a carbon atom;

$R_{12}$, $R_{13}$, $R_{14}$, $R_{15}$ and $R_{16}$ each represents an alkyl group or an alicyclic hydrocarbon group, provided that at least one of $R_{12}$ to $R_{14}$, or either $R_{15}$ or $R_{16}$, represents an alicyclic hydrocarbon group;

$R_{17}$, $R_{18}$, $R_{19}$, $R_{20}$ and $R_{21}$ each represents a hydrogen atom, an alkyl group or an alicyclic hydrocarbon group, provided that at least one of $R_{17}$ to $R_{21}$ represents an alicyclic hydrocarbon group, and either $R_{19}$ or $R_{21}$ represents an alkyl group or an alicyclic hydrocarbon group;

$R_{22}$, $R_{23}$, $R_{24}$ and $R_{25}$ each represents an alkyl group or an alicyclic hydrocarbon group, provided that at least one of $R_{22}$ to $R_{25}$ represents an alicyclic hydrocarbon group, and $R_{23}$ and $R_{24}$ may be bonded to each other to form a ring;

(II-AB)

wherein $R_{11}'$ and $R_{12}'$ each represents a hydrogen atom, a cyano group, a halogen atom or an alkyl group; and Z' represents an atomic group to form an alicyclic structure together with the bonded two carbon atoms (C—C).

6. The chemical amplification resist composition as described in the item 1, wherein the solvent (D) is a single solvent of alkyl lactate or propylene glycol monoalkyl ether carboxylate, or a mixed solvent containing at least two solvents selected from the group consisting of propylene glycol monoalkyl ether carboxylate, propylene glycol monoalkyl ether, cyclohexanone, and alkyl lactate.

7. The chemical amplification resist composition as described in any one of the items 1 to 6, which further contains a nitrogen-containing basic compound.

8. The chemical amplification resist composition as described in any one of the items 1 to 7, which further contains a surfactant containing at least one of a fluorine atom and a silicon atom.

9. A pattern-forming method comprising, forming a resist film with the chemical amplification resist composition as described in the items 1 to 8; and exposing and developing the resist film.

The invention can provide a chemical amplification resist composition improved in the problem of development defect, from which an excellent resist pattern profile can be obtained, and capable of preventing the collapse of a pattern, and a pattern-forming method using the same.

DETAILED DESCRIPTION OF THE INVENTION

The invention is described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group.

[1] Resin Increasing the Solubility in an Alkali Developer by the Action of an Acid (Component (A)):

A resin increasing the solubility in an alkali developer by the action of an acid for use in a chemical amplification resist composition in the invention is a resin having a group decomposable by the action of an acid (hereinafter also referred to as "an acid-decomposable group") on the main chain or side chain, or both main and side chains, of the resin.

A preferred group decomposable by the action of an acid is a —COOH group whose hydrogen atom is substituted with a group that is desorbed by an acid.

Preferred acid-decomposable groups are a cumyl ester group, an enol ester group, an acetal ester group, and a tertiary alkyl ester group, and a more preferred group is a tertiary alkyl ester group.

It is preferred for the resin of component (A) to have an alicyclic hydrocarbon group.

As a resin having an alicyclic hydrocarbon group and increasing the solubility in an alkali developer by the action of an acid (hereinafter also referred to as "an alicyclic hydrocarbon-based acid-decomposable resin"), it is preferred to have at least one repeating unit selected from the group consisting of a repeating unit having a partial structure containing alicyclic hydrocarbon represented by any of the following formulae (pI) to (pVI), and a repeating unit represented by the following formula (II-AB):

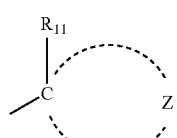

(pI)

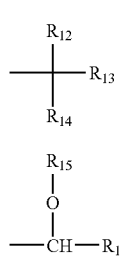

(pII)

(pIII)

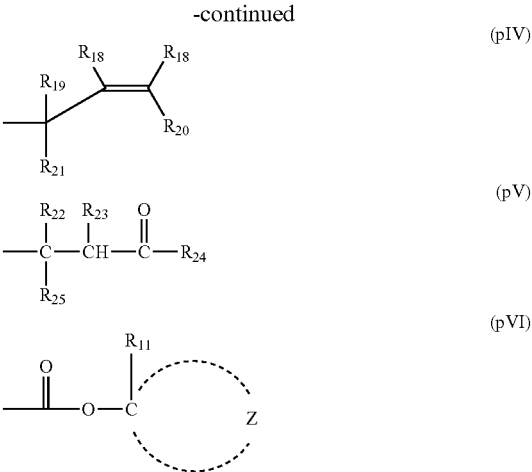

(pIV)

(pV)

(pVI)

In formulae (pI) to (pVI), $R_{11}$ represents an alkyl group; Z represents an atomic group necessary to form an alicyclic hydrocarbon group together with a carbon atom;

$R_{12}$, $R_{13}$, $R_{14}$, $R_{15}$ and $R_{16}$ each represents an alkyl group or an alicyclic hydrocarbon group, provided that at least one of $R_{12}$ to $R_{14}$, or either $R_{15}$ or $R_{16}$, represents an alicyclic hydrocarbon group;

$R_{17}$, $R_{18}$, $R_{19}$, $R_{20}$ and $R_{21}$ each represents a hydrogen atom, an alkyl group or an alicyclic hydrocarbon group, provided that at least one of $R_{17}$ to $R_{21}$ represents an alicyclic hydrocarbon group, and either $R_{19}$ or $R_{21}$ represents an alkyl group or an alicyclic hydrocarbon group;

$R_{22}$, $R_{23}$, $R_{24}$ and $R_{25}$ each represents an alkyl group or an alicyclic hydrocarbon group, provided that at least one of $R_{22}$ to $R_{25}$ represents an alicyclic hydrocarbon group, and $R_{23}$ and $R_{24}$ may be bonded to each other to form a ring.

(II-AB)

In formula (II-AB), $R_{11}'$ and $R_{12}'$ each represents a hydrogen atom, a cyano group, a halogen atom or an alkyl group; and Z' contains bonded two carbon atoms (C—C) and represents an atomic group to form an alicyclic structure.

Formula (II-AB) is more preferably represented by the following formula (II-A) or (II-B).

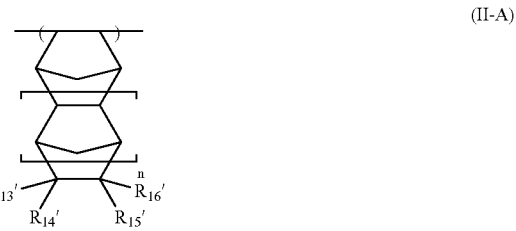

(II-A)

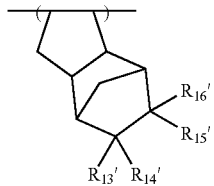

(II-B)

In formulae (II-A) and (II-B), $R_{13}'$, $R_{14}'$, $R_{15}'$, and $R_{16}'$ each represents a hydrogen atom, a halogen atom, a cyano group, —COOH, —COOR$_5$, a group decomposable by the action of an acid, —C(=O)—X-A'-R$_{17}'$, an alkyl group, or a cyclic hydrocarbon group, and at least two of $R_{13}'$ to $R_{16}'$ may be bonded to each other to form a ring; n represents 0 or 1;

$R_5$ represents an alkyl group, a cyclic hydrocarbon group, or a —Y group shown below;

X represents an oxygen atom, a sulfur atom, —NH—, —NHSO$_2$— or —NHSO$_2$NH—;

A' represents a single bond or a divalent linking group;

$R_{17}'$ represents —COOH, —COOR$_5$, —CN, a hydroxyl group, an alkoxyl group, —CO—NH—R$_6$, —CO—NH—SO$_2$—R$_6$, or a —Y group shown below;

$R_6$ represents an alkyl group or a cyclic hydrocarbon group.

—Y group:

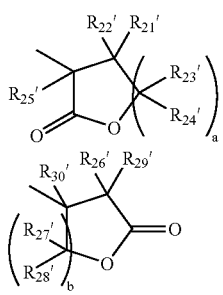

In —Y group, $R_{21}'$ to $R_{30}'$ each represents a hydrogen atom or an alkyl group;

a and b each represents 1 or 2.

In formulae (pI) to (pVI), the alkyl group represented by $R_{11}$ to $R_{25}$ may be a substituted or unsubstituted alkyl group, preferably a straight chain or branched alkyl group having from 1 to 4 carbon atoms, e.g., a methyl group, an ethyl group, an n-propyl group, an isopropyl group, an n-butyl group, an isobutyl group, a sec-butyl group, a t-butyl group, etc.

As the substituents of the substituted alkyl group, an alkoxyl group having from 1 to 4 carbon atoms, a halogen atom (a fluorine atom, a chlorine ion, a bromine ion, an iodine ion), an acyl group, an acyloxy group, a cyano group, a hydroxyl group, a carboxyl group, an alkoxycarbonyl group, and a nitro group can be exemplified.

The alicyclic hydrocarbon groups represented by $R_{12}$ to $R_{25}$, and the alicyclic hydrocarbon group formed by Z and a carbon atom may be monocyclic or polycyclic. Specifically groups having a monocyclic, bicyclic, tricyclic or tetracyclic structure and having 5 or more carbon atoms can be exemplified. The carbon atoms of the alicyclic hydrocarbon groups are preferably from 6 to 30, particularly preferably from 7 to 25. These alicyclic hydrocarbon groups may have a substituent.

The examples of preferred alicyclic hydrocarbon groups include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group, and a cyclododecanyl group, and more preferred groups are an adamantyl group, a decalin residue, a norbornyl group, a cedrol group, a cyclohexyl group, a cycloheptyl group, a cyclooctyl group, a cyclodecanyl group, and a cyclododecanyl group.

As the substituents of these alicyclic hydrocarbon groups, an alkyl group, a halogen atom, a hydroxyl group, an alkoxyl group, a carboxyl group, and an alkoxycarbonyl group are exemplified. As the alkyl group, lower alkyl groups, e.g., a methyl group, an ethyl group, a propyl group, an isopropyl group and a butyl group are preferred, and a methyl group, an ethyl group, a propyl group and an isopropyl group are more preferred. As the alkoxyl group, alkoxyl groups having from 1 to 4 carbon atoms, e.g., a methoxy group, an ethoxy group, a propoxy group and a butoxy group are exemplified. These alkyl group and alkoxyl group may further have a substituent, and as such further substituents of the alkyl and alkoxyl groups, a hydroxyl group, a halogen atom and an alkoxyl group can be exemplified.

The structures represented by formulae (pI) to (pVI) in the resin of component (A) can be used for the protection of an alkali-soluble group. As the alkali-soluble groups, various groups known in the technical industry can be exemplified.

The specific examples of alkali-soluble groups are a carboxylic acid group, a sulfonic acid group, a phenol group and a thiol group, preferably a carboxylic acid group and a sulfonic acid group.

As a preferred alkali-soluble group protected with the structure represented by any of formulae (pI) to (pVI) in the resin of component (A), a carboxyl group having a structure whose hydrogen atom is substituted with a structure represented by any of formulae (pI) to (pVI) is exemplified.

As a repeating unit having an alkali-soluble group protected with the structure represented by any of formulae (pI) to (pVI), a repeating unit represented by the following formula (pA) is preferred.

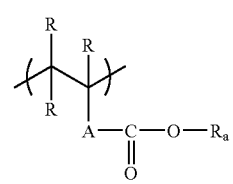

(pA)

In formula (pA), R represents a hydrogen atom, a halogen atom, or a substituted or unsubstituted, straight chain or branched alkyl group having from 1 to 4 carbon atoms. A plurality of R may be the same or different.

A represents a single group or a combination comprising two or more groups selected from the group consisting of a single bond, an alkylene group, an ether group, a thioether group, a carbonyl group, an ester group, an amido group, a sulfonamido group, a urethane group and a urea group. The alkylene group may have a substituent.

Ra represents a group represented by any of formulae (pI) to (pVI).

The repeating unit represented by (pA) is most preferably a repeating unit by 2-alkyl-2-adamantyl(meth)acrylate, dialkyl(1-adamantyl)methyl(meth)acrylate, or 1-ethyl-2-isopropyl-5-methyl-cyclohexyl (meth)acrylate.
The specific examples of the repeating units represented by formula (pA) are shown below.
In the formulae, Rx represents H, CH$_3$', CH$_2$OH or CF$_3$.
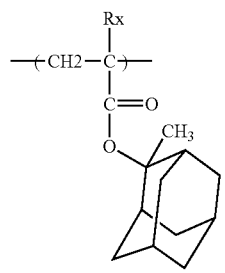
1
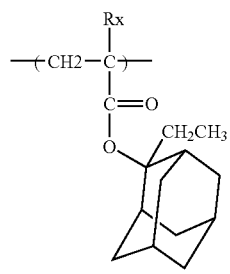
2
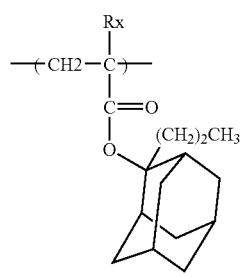
3
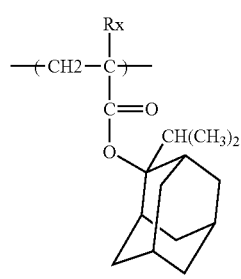
4
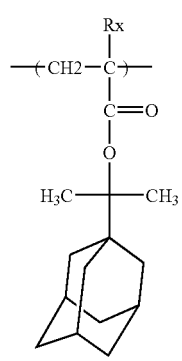
5
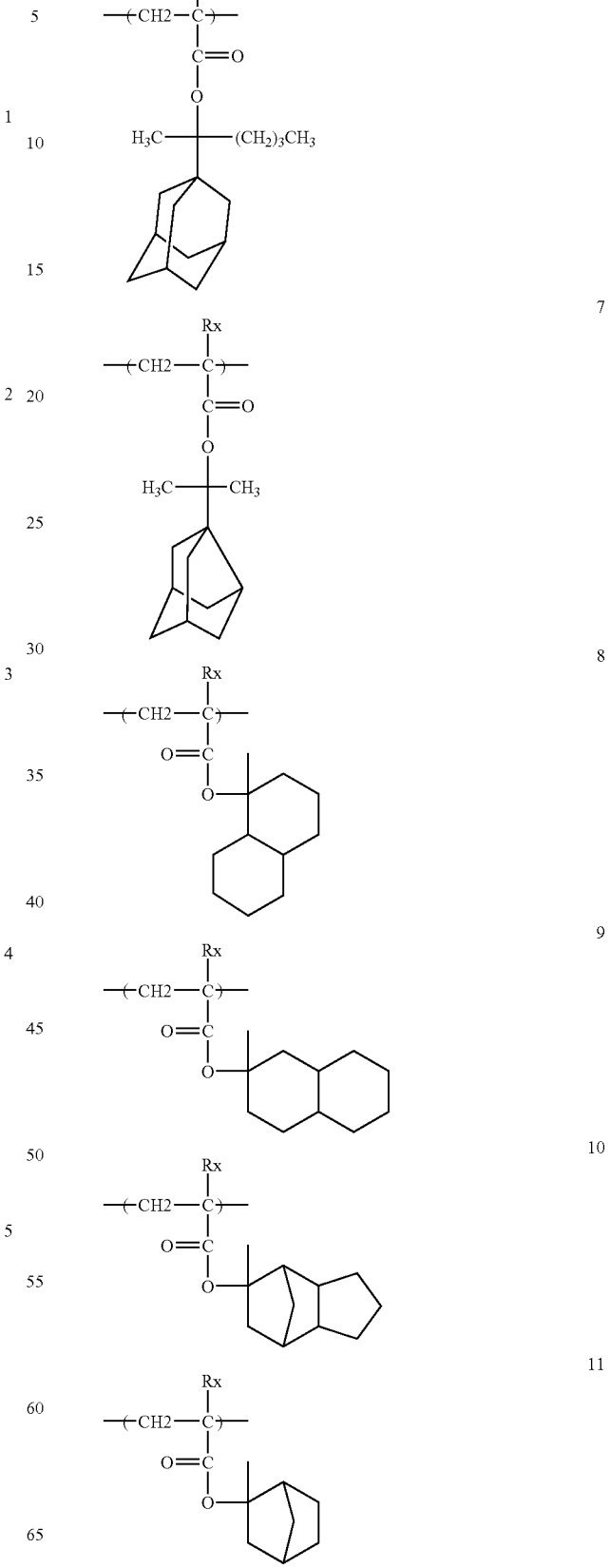

-continued
12
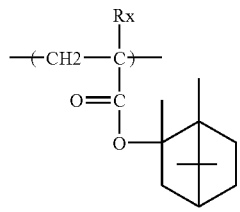
13
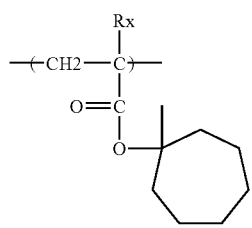
14
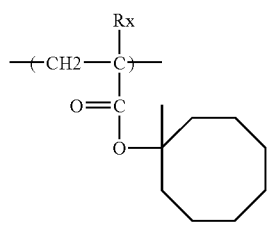
15
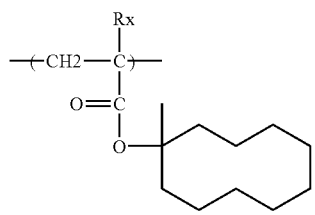
16
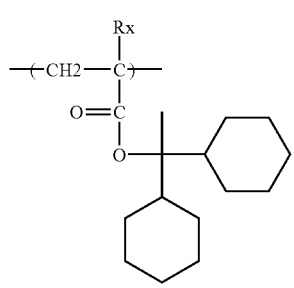
17
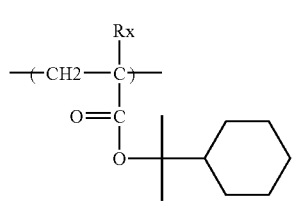
-continued
18
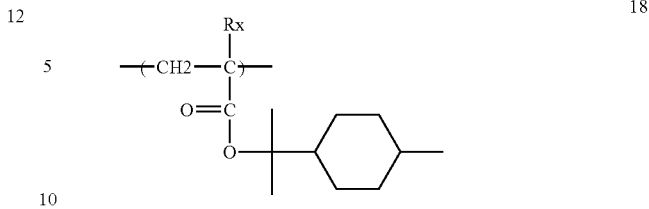
19
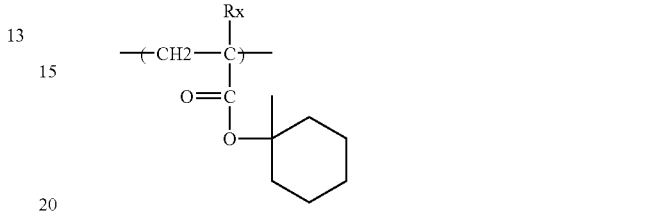
20
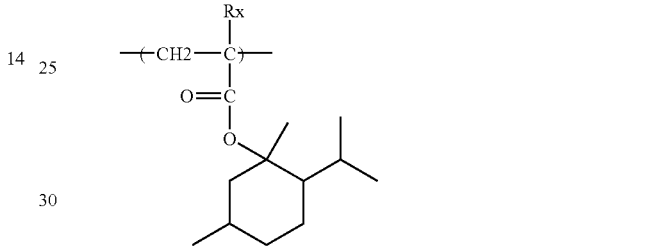
21
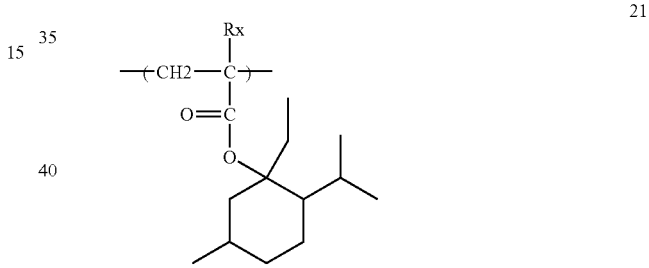
22
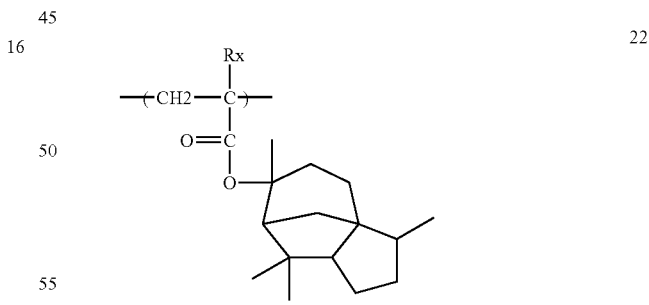
23
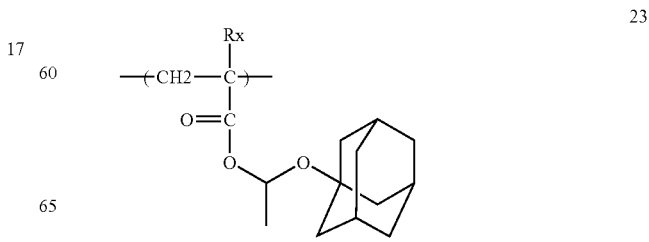

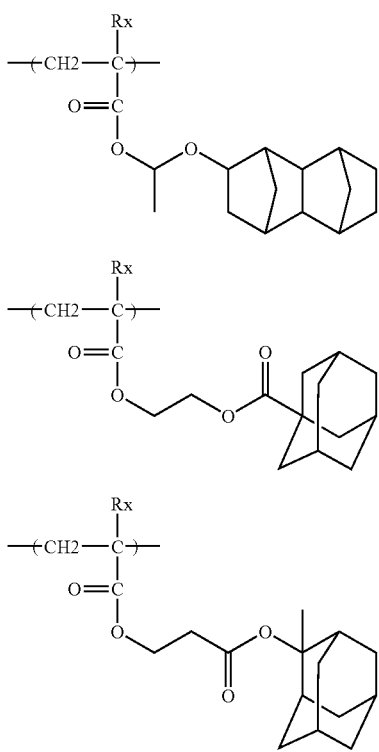

In the above formula (II-AB), $R_{11}'$ and $R_{12}'$ each represents a hydrogen atom, a cyano group, a halogen atom or an alkyl group. Z' contains bonded two carbon atoms (C—C) and represents an atomic group to form an alicyclic structure which may have a substituent.

As the halogen atoms represented by $R_{11}'$ and $R_{12}'$, a chlorine atom, a bromine atom, a fluorine atom and an iodine atom are exemplified.

As the alkyl groups represented by $R_{11}'$ and $R_{12}'$, straight chain or branched alkyl groups having from 1 to 10 carbon atoms are preferred, more preferably straight chain or branched alkyl groups having from 1 to 6 carbon atoms, and a methyl group, an ethyl group, a propyl group, an isopropyl group, an n-butyl group, an isobutyl group, a sec-butyl group and a t-butyl group are more preferred.

The above alkyl groups may further have a substituent, and as such substituents, a hydroxyl group, a halogen atom, a carboxyl group, an alkoxyl group, an acyl group, a cyano group and an acyloxy group are exemplified. As the halogen atom, a chlorine atom, a bromine atom, a fluorine atom and an iodine atom are exemplified. As the alkoxyl group, alkoxyl groups having from 1 to 4 carbon atoms, e.g., a methoxy group, an ethoxy group, a propoxy group and a butoxy group are exemplified. As the acyl group, a formyl group and an acetyl group are exemplified. As the acyloxy group, an acetoxy group is exemplified.

The atomic group represented by Z' for forming an alicyclic structure is an atomic group for forming a repeating unit of alicyclic hydrocarbon of a resin, which may have a substituent, and an atomic group for forming a crosslinking alicyclic structure forming a crosslinking alicyclic hydrocarbon repeating unit is particularly preferred.

As the skeleton of alicyclic hydrocarbon formed, the same alicyclic hydrocarbon groups as those represented by $R_{11}$ to $R_{25}$ in formulae (pI) to (pVI) are exemplified.

The skeleton of alicyclic hydrocarbon may have a substituent, and as the substituents, the groups represented by $R_{13}'$ to $R_{16}'$ in formula (II-A) or (II-B) can be exemplified.

Of the repeating units having crosslinking alicyclic hydrocarbon, repeating units represented by formula (II-A) or (II-B) are more preferred.

In the alicyclic hydrocarbon-based acid-decomposable resin in the invention, an acid-decomposable group may be contained in —C(=O)—X-A'-$R_{17}'$, or may be contained as the substituent of Z' in formula (II-AB).

The structure of an acid-decomposable group is represented by formula —C(=O)—$X_1$—$R_0$.

In the above formula, $R_0$ represents a tertiary alkyl group, e.g., a t-butyl group or a t-amyl group, an isoboronyl group, a 1-alkoxyethyl group, e.g., a 1-ethoxyethyl group, a 1-butoxyethyl group, a 1-isobutoxyethyl group, or a 1-cyclohexyloxyethyl group, an alkoxymethyl group, e.g., a 1-methoxymethyl group or a 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group, or a mevalonic lactone residue. $X_1$ has the same meaning as X above.

As the halogen atoms represented by $R_{13}'$, $R_{14}'$, $R_{15}'$ and $R_{16}'$ in formulae (II-A) and (II-B), a chlorine atom, a bromine atom, a fluorine atom and an iodine atom can be exemplified.

The alkyl groups represented by $R_5$, $R_6$, $R_{13}'$ to $R_{16}'$, $R_{21}'$ to $R_{30}'$ are preferably straight chain or branched alkyl groups having from 1 to 10 carbon atoms, more preferably straight chain or branched alkyl groups having from 1 to 6 carbon atoms, and still more preferably a methyl group, an ethyl group, a propyl group, an isopropyl group, an n-butyl group, an isobutyl group, a sec-butyl group and t-butyl.

The cyclic hydrocarbon groups represented by $R_5$, $R_6$, $R_{13}'$, $R_{14}'$, $R_{15}'$ and $R_{16}'$ are cyclic alkyl groups and crosslinking hydrocarbon groups, e.g., a cyclopropyl group, a cyclopentyl group, a cyclohexyl group, an adamantyl group, a 2-methyl-2-adamantyl group, a norbornyl group, a boronyl group, an isoboronyl group, a tricyclodecanyl group, a dicyclopentenyl group, a norbornanepoxy group, a menthyl group, an isomenthyl group, a neomenthyl group, and a tetracyclododecanyl group are exemplified.

As the ring formed by bonding at least two of $R^{13'}$ to $R^{16'}$, rings having from 5 to 12 carbon atoms, e.g., cyclopentene, cyclohexene, cycloheptane and cyclooctane can be exemplified.

As the alkoxyl group represented by $R_{17}'$, alkoxyl groups having from 1 to 4 carbon atoms, e.g., a methoxy group, an ethoxy group, a propoxy group and a butoxy group can be exemplified.

As further substituents of the alkyl, cyclic hydrocarbon and alkoxyl groups, a hydroxyl group, a halogen atom, a carboxyl group, an alkoxyl group, an acyl group, a cyano group, an acyloxy group, an alkyl group, and a cyclic hydrocarbon group can be exemplified. As the halogen atom, a chlorine atom, a bromine atom, a fluorine atom and an iodine atom can be exemplified. As the alkoxyl group, alkoxyl groups having from 1 to 4 carbon atoms, e.g., a methoxy group, an ethoxy group, a propoxy group and a butoxy group can be exemplified. As the acyl group, a formyl group and an acetyl group can be exemplified, and as the acyloxy group, an acetoxy group can be exemplified.

As the alkyl and cyclic hydrocarbon groups, those described above can be exemplified.

As the divalent linking group represented by A', a single group or combinations comprising two or more groups selected from the group consisting of an alkylene group, an ether group, a thioether group, a carbonyl group, an ester group, an amido group, a sulfonamido group, a urethane group and a urea group can be exemplified. The alkylene group may further have a substituent.

In the alicyclic hydrocarbon-based acid-decomposable resin in the invention, a group decomposable by the action of an acid can contain at least one repeating unit of a repeating unit having a partial structure containing alicyclic hydrocarbon represented by any of formulae (pI) to (pVI), a repeating unit represented by formula (II-AB), and a repeating unit of the later-described copolymerization component.

The various substituents represented by $R_{13}'$ to $R_{16}'$ in formulae (II-A) and (II-b) are also the substituents of the atomic group for forming an alicyclic structure in formula (II-AB) or the atomic group Z for forming a crosslinking alicyclic structure.

As the specific examples of the repeating units represented by formulae (II-A) and (II-B), the following compounds are exemplified, but the invention is not limited thereto.

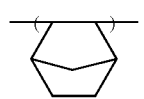

[II-1]

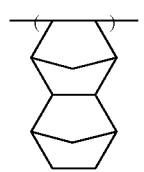

[II-2]

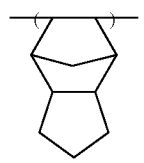

[II-3]

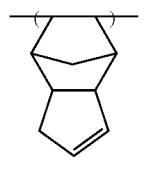

[II-4]

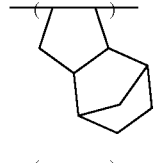

[II-5]

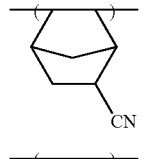

[II-6]

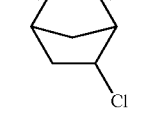

[II-7]

-continued

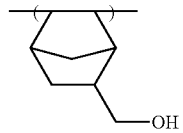

[II-8]

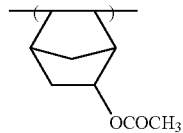

[II-9]

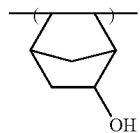

[II-10]

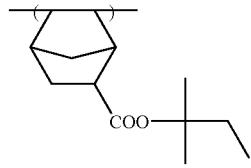

[II-11]

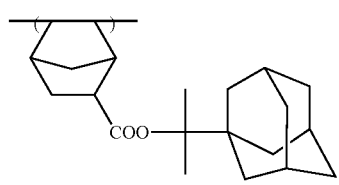

[II-12]

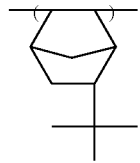

[II-13]

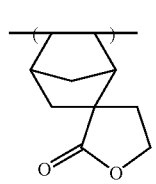

[II-14]

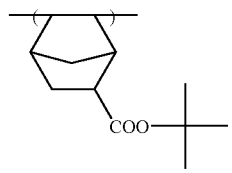

[II-15]

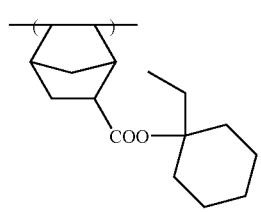

[II-16]

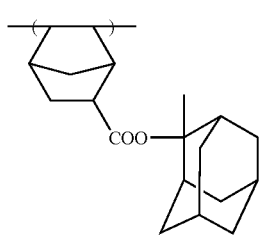 [II-17]
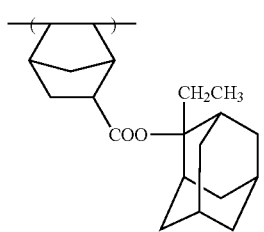 [II-18]
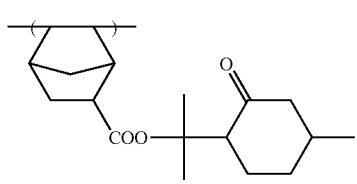 [II-19]
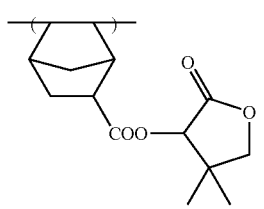 [II-20]
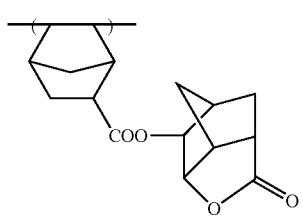 [II-21]
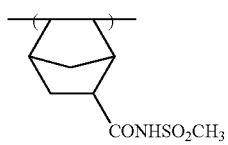 [II-22]
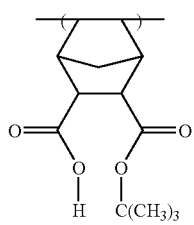 [II-23]
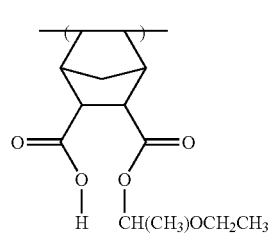 [II-24]
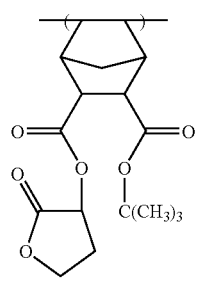 [II-25]
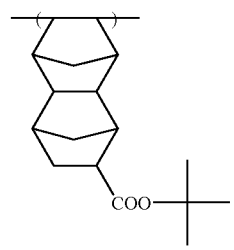 [II-26]
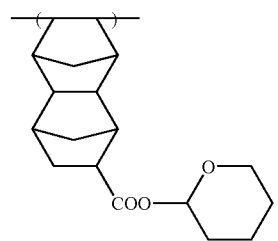 [II-27]
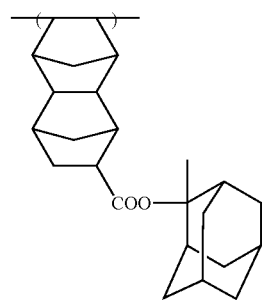 [II-28]

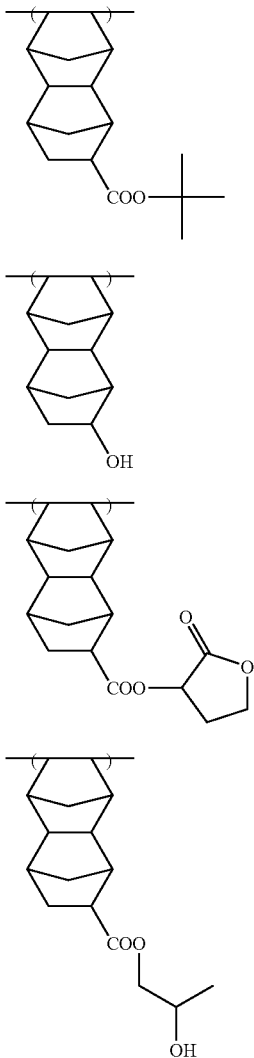

[II-29]

[II-30]

[II-31]

[II-32]

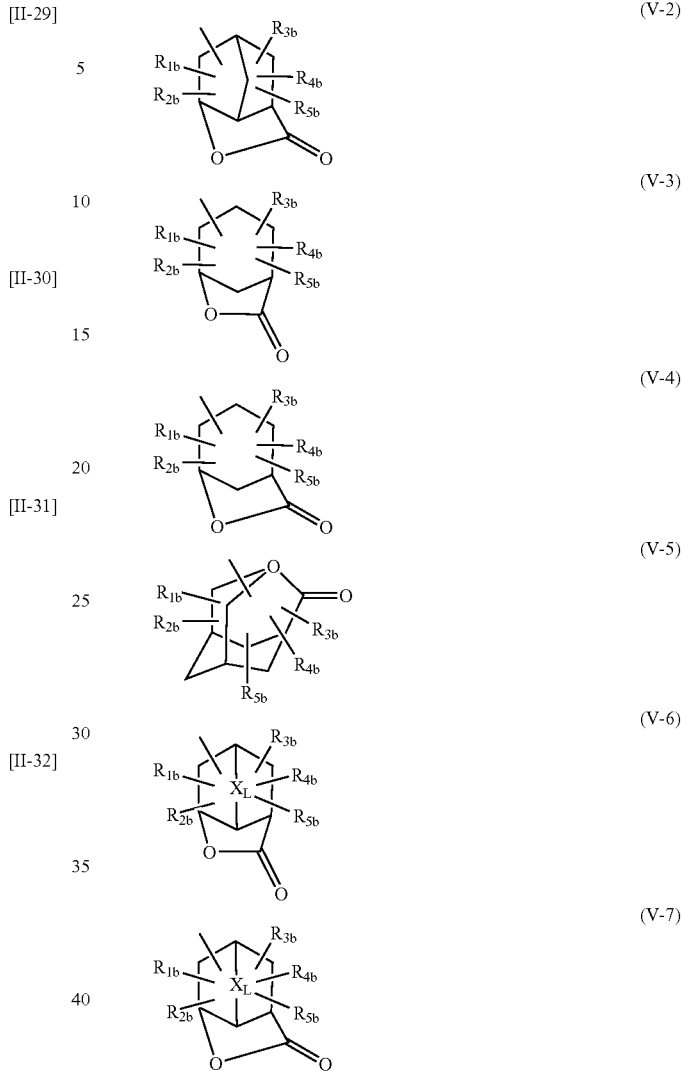

It is preferred for the alicyclic hydrocarbon-based acid-decomposable resin in the invention to have a lactone group, more preferably have a repeating unit having a group having a lactone structure represented by the following formula (Lc) or any of formulae (V-1) to (V-7), and the group having a lactone structure may be directly bonded to the main chain.

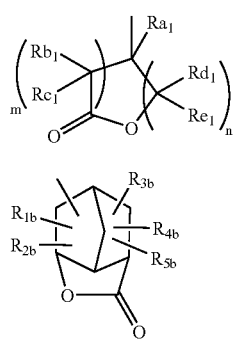

In formula (Lc), $R_{a1}$, $R_{b1}$, $R_{c1}$, $R_{d1}$ and $R_{e1}$ each represents a hydrogen atom or an alkyl group; m and n each represents an integer of from 0 to 3, and m+n is from 2 to 6.

In formulae (V-1) to (V-7), $R_{1b}$, $R_{2b}$, $R_{3b}$, $R_{4b}$ and $R_{5b}$ each represents a hydrogen atom, an alkyl group, a cycloalkyl group, an alkoxyl group, an alkoxycarbonyl group, an alkyl-sulfonyl-imino group, or an alkenyl group. Two of $R_{1b}$ to $R_{5b}$ may be bonded to each other to form a ring.

In formulae (V-6) and (V-7), $X_L$ represents —O—, —S—, —SO$_2$— or —N($R_{XL}$)—. $R_{XL}$ represents a hydrogen atom, a hydroxyl group, an alkyl group or —OSO$_2$—$R_{XL1}$. $R_{XL1}$ represents an alkyl group, a cycloalkyl group, or a camphor residue.

As the alkyl groups represented by $R_{a1}$ to $R_{e1}$ in formula (Lc), and as the alkyl groups in the alkyl group, alkoxyl group, alkoxycarbonyl group and alkylsulfonylimino group represented by $R_{1b}$ to $R_{5b}$ in formulae (V-1) to (V-7), straight chain or branched alkyl groups are exemplified, and these alkyl groups may have a substituent.

As the repeating units having a group having a lactone structure represented by formula (Lc) or any of formulae (V-1) to (V-7), repeating units represented by formula (II-A) or (II-B) in which at least one of $R_{13}'$ to $R_{16}'$ has a group represented by formula (Lc) or any group represented by formulae (V-1) to (V-7) (e.g., $R_5$ of —$COOR_5$ represents a group represented by formula (Lc) or represented by any of formulae (V-1) to (V-7)), or a repeating unit represented by the following formula (AI) can be exemplified.

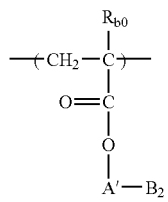
(AI)

In formula (AI), $R_{b0}$ represents a hydrogen atom, a halogen atom or an alkyl group. The alkyl group represented by $R_{b0}$ is preferably an alkyl group having from 1 to 4 carbon atoms. The alkyl group represented by $R_{b0}$ may further have a substituent.

As the halogen atom represented by $R_{b0}$, a fluorine atom, a chlorine atom, a bromine atom or an iodine atom can be exemplified. $R_{b0}$ preferably represents a hydrogen atom.

A' represents a single bond, an ether group, an ester group, a carbonyl group, an alkylene group, or a divalent group obtained by combining these groups.

$B_2$ represents a group represented by formula (Lc) or a group represented by any of formulae (V-1) to (V-7).

The specific examples of repeating units having a lactone structure are shown below, but the invention is not limited thereto.

(In the formulae, Rx represents H, $CH_3$ or $CF_3$.)

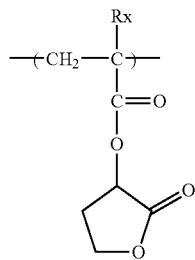
(IV-1)

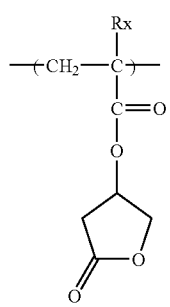
(IV-2)

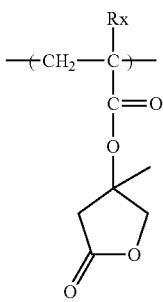
(IV-3)

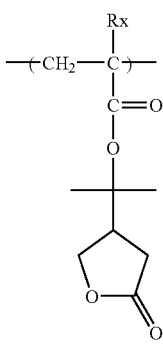
(IV-4)

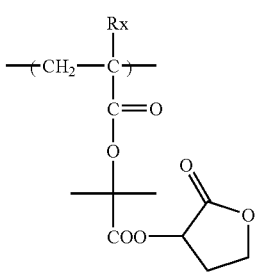
(IV-5)

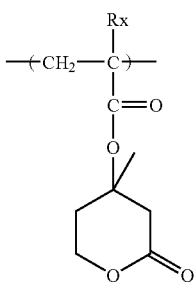
(IV-6)

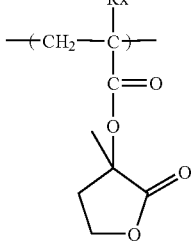
(IV-7)

-continued
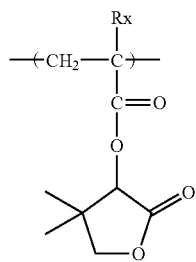
(IV-8)
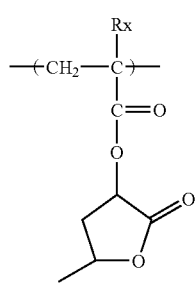
(IV-9)
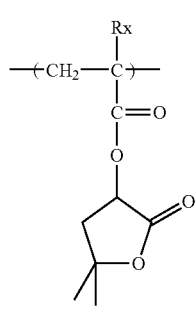
(IV-10)
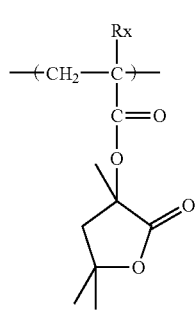
(IV-11)
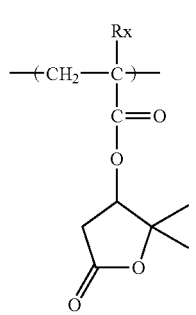
(IV-12)
-continued
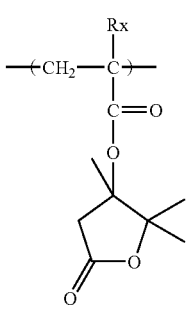
(IV-13)
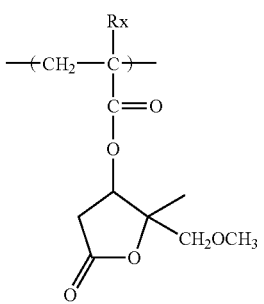
(IV-14)
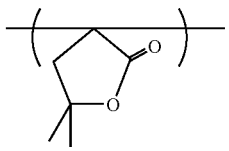
(IV-15)
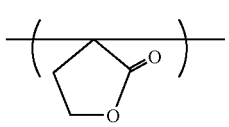
(IV-16)
(In the formulae, Rx represents H, CH$_3$ or CF$_3$.)
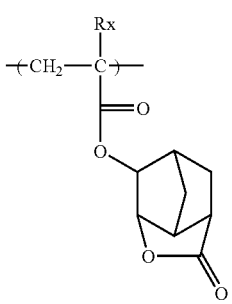
(Ib-1)
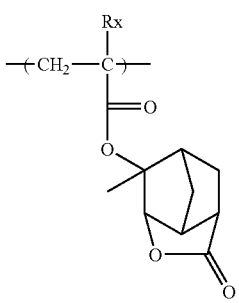
(Ib-2)

(Ib-3) 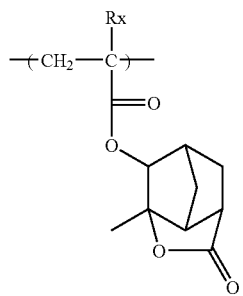
(Ib-4) 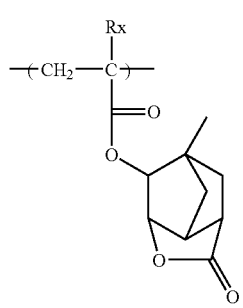
(Ib-5) 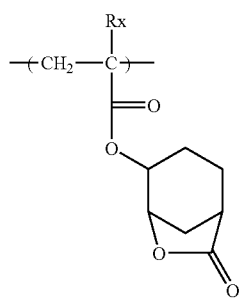
(Ib-6) 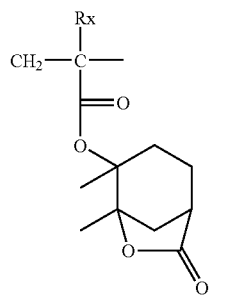
(Ib-7) 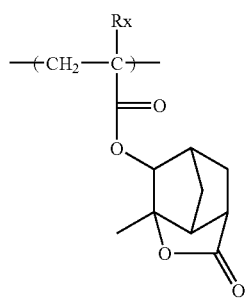
(Ib-8) 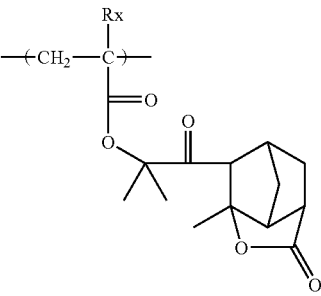
(Ib-9) 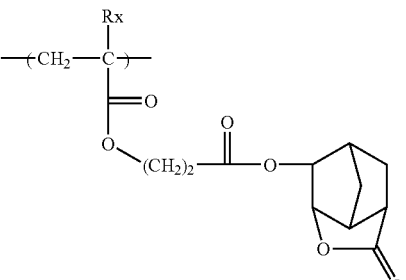
(Ib-10) 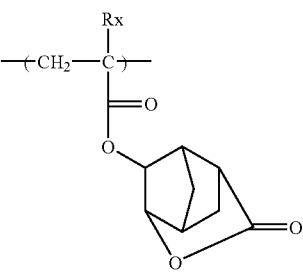
(Ib-11) 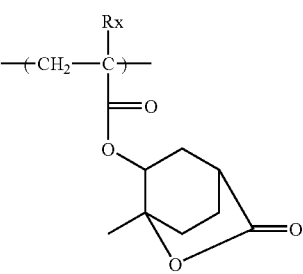
(Ib-12) 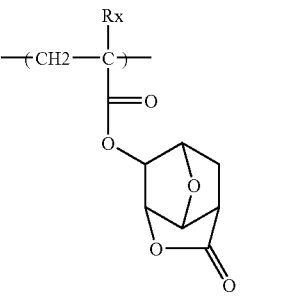

-continued
(Ib-13)
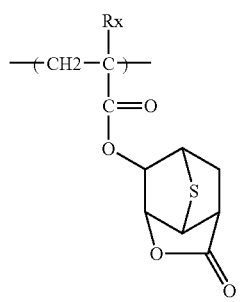
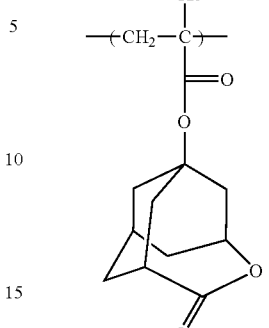
(Ib-14)
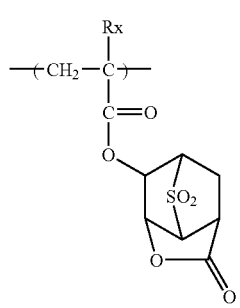
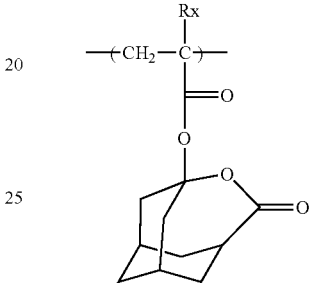
(Ib-15)
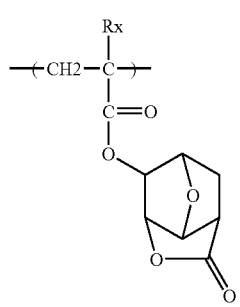
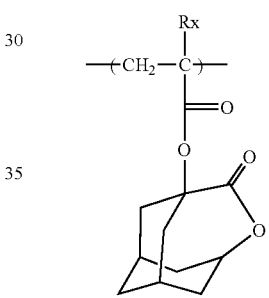
(Ib-16)
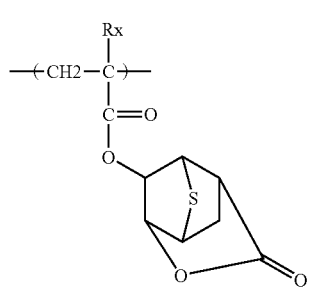
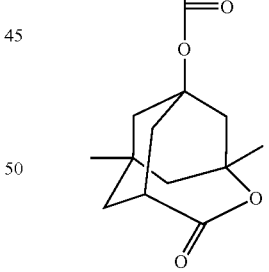
(Ib-17)
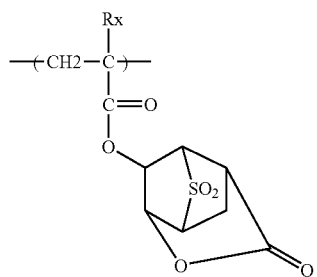
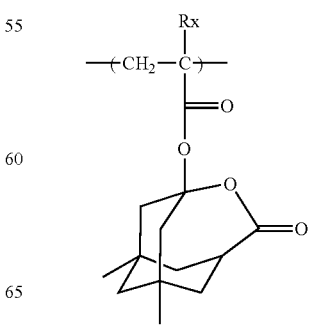
(In the formulae, Rx represents H, CH$_3$ or CF$_3$.)

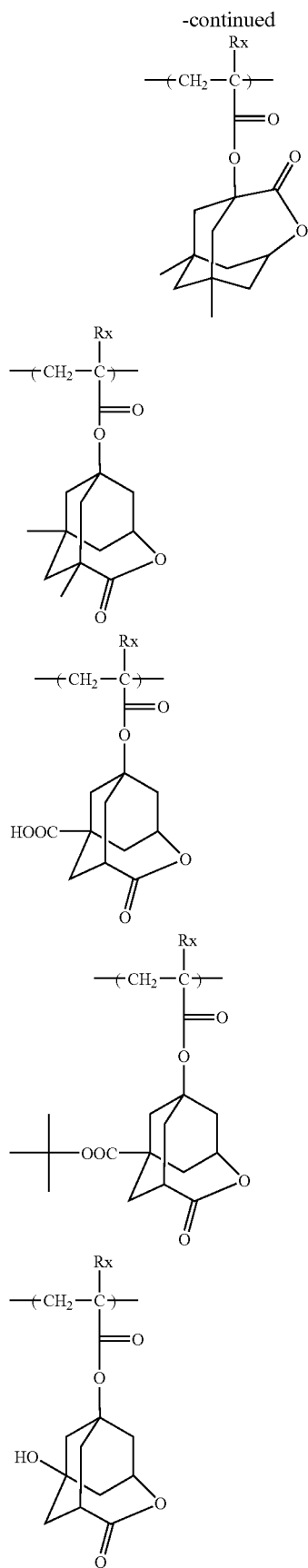

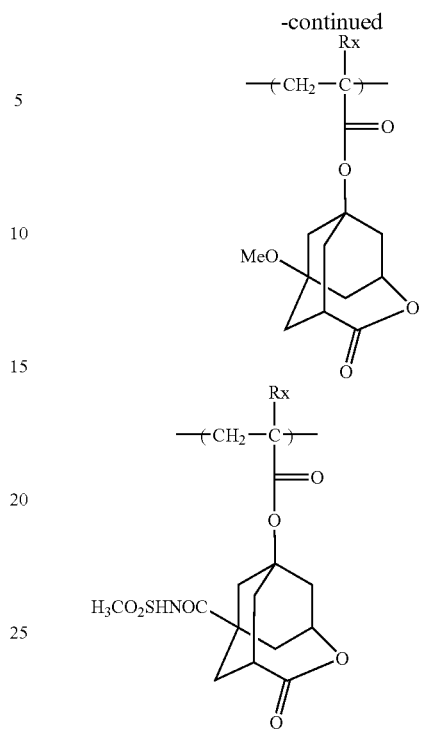

The alicyclic hydrocarbon-based acid-decomposable resin in the invention may have a repeating unit having a group represented by the following formula (VII).

(VII)

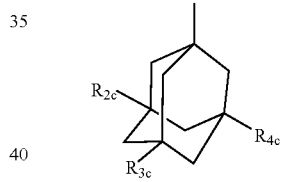

In formula (VII), $R_{2c}$, $R_{3c}$, and $R_{4c}$ each represents a hydrogen atom or a hydroxyl group, provided that at least one of $R_{2c}$ to $R_{4c}$ represents a hydroxyl group.

The group represented by formula (VII) is preferably dihydroxy or monohydroxy, preferably dihydroxy.

As the repeating unit having a group represented by formula (VII), repeating units represented by formula (II-A) or (II-B) in which at least one of $R_{13}'$ to $R_{16}'$ has a group represented by formula (VII) (e.g., $R_5$ of —$COOR_5$ represents a group represented by formula (VII)), or a repeating unit represented by the following formula (AII) can be exemplified.

(AII)

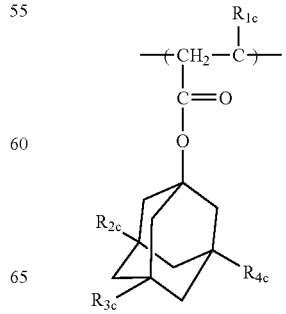

In formula (AII), $R_{1c}$ represents a hydrogen atom or a methyl group.

$R_{2c}$, $R_{3c}$ and $R_{4c}$ each represents a hydrogen atom or a hydroxyl group, provided that at least one of $R_{2c}$ to $R_{4c}$ represents a hydroxyl group, preferably two of $R_{2c}$ to $R_{4c}$ represent a hydroxyl group.

The specific examples of repeating units having the structure represented by formula (AII) are shown below, but the invention is not limited thereto.

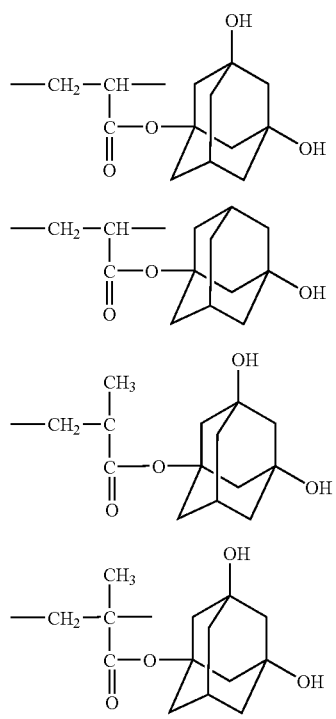

The alicyclic hydrocarbon-based acid-decomposable resin in the invention may have a repeating unit represented by the following formula (VIII).

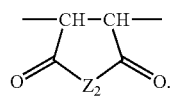
(VIII)

In formula (VIII), $Z_2$ represents —O— or —N($R_{41}$)—; $R_{41}$ represents a hydrogen atom, a hydroxyl group, an alkyl group, or —OSO$_2$—$R_{42}$; $R_{42}$ represents an alkyl group, a cycloalkyl group or a camphor residue; the alkyl group may have a substituent, e.g., a halogen atom.

As the specific examples of the repeating units represented by formula (VIII), the following [I'-1] to [I'-7] are exemplified, but the invention is not limited thereto.

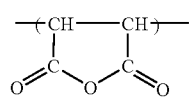
[I'-1]

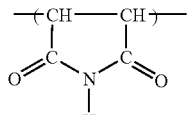
[I'-2]

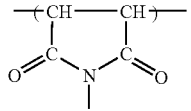
[I'-3]

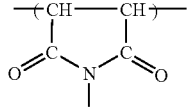
[I'-4]

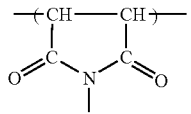
[I'-5]

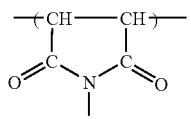
[I'-6]

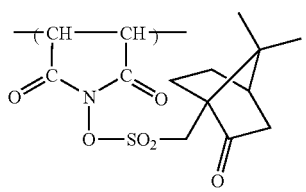
[I'-7]

The alicyclic hydrocarbon-based acid-decomposable resin in the invention can contain various repeating units other than the above repeating units for the purpose of adjusting dry etching resistance, aptitude for standard developing solutions, adhesion to a substrate, resist profile, and further, generally necessary characteristics such as resolution, heat resistance and sensitivity.

As such repeating units, repeating units corresponding to the monomers shown below can be exemplified, but the invention is not limited thereto.

By containing various kinds of repeating units, fine adjustment of performances required of the alicyclic hydrocarbon-based acid-decomposable resins, in particular fine adjustment of the following performances becomes possible, that is, (1) Solubility in a coating solvent,
(2) A film-forming property (a glass transition point),
(3) Alkali developability,
(4) Decrease of layer thickness (hydrophobic-hydrophilic property, selection of an alkali-soluble group),
(5) Adhesion of an unexposed area to a substrate, and
(6) Dry etching resistance.

The examples of such monomers include compounds having one addition polymerizable unsaturated bond selected from acrylic esters, methacrylic esters, acrylamides, methacryl-amides, allyl compounds, vinyl ethers and vinyl esters.

In addition to the aforementioned compounds, addition polymerizable unsaturated compounds copolymerizable with the monomers corresponding to the above various repeating structural units may be used for copolymerization.

In the alicyclic hydrocarbon-based acid-decomposable resin of the invention, the molar ratio of the content of each repeating structural unit is arbitrarily selected to adjust dry etching resistance, aptitude for standard developing solutions, adhesion to the substrates, and resist profile, in addition to these, to adjust general requisite characteristics of resists, e.g., resolution, heat resistance and sensitivity.

As preferred embodiments of the alicyclic hydrocarbon-based acid-decomposable resin of the invention, the following resins can be exemplified.

(1) A resin having a repeating unit having a partial structure containing alicyclic hydrocarbon represented by any of formulae (pI) to (pVI) (a side chain type);
(2) A resin having a repeating unit represented by formula (II-AB) (a main chain type); provided that the following is further exemplified as embodiment (2):
(3) A resin having a repeating unit represented by formula (II-AB), a maleic acid derivative and (meth)acrylate structure (a hybrid type).

The content of a repeating unit having an acid-decomposable croup in the alicyclic hydrocarbon-based acid-decomposable resin is preferably from 10 to 70 mol % in the total repeating structural units, more preferably from 20 to 65 mol %, and still more preferably from 25 to 60 mol %.

The content of a repeating unit having a partial structure containing alicyclic hydrocarbon represented by any of formulae (pI) to (pVI) in the alicyclic hydrocarbon-based acid-decomposable resin is preferably from 20 to 70 mol % in the total repeating structural units, more preferably from 24 to 65 mol %, and still more preferably from 28 to 60 mol %.

The content of a repeating unit represented by formula (II-AB) in the alicyclic hydrocarbon-based acid-decomposable resin is preferably from 10 to 60 mol % in the total repeating structural units, more preferably from 15 to 55 mol %, and still more preferably from 20 to 50 mol %.

The content of the repeating structural units on the basis of the monomers of further copolymerization components in the resin can also be optionally set according to the desired resist performances, and the content is generally preferably 99 mol % or less to the total mol number of a repeating structural unit having a partial structure containing the alicyclic hydrocarbon represented by any of formulae (pI) to (pVI) and a repeating unit represented by formula (II-AB), more preferably 90 mol % or less, and still more preferably 80 mol % or less.

When the composition in the invention is for ArF exposure, it is preferred that the resin does not have aromatic groups from the aspect of the transparency to ArF rays.

The alicyclic hydrocarbon-based acid-decomposable resin of the invention can be synthesized according to ordinary methods (e.g., radical polymerization). For example, as ordinary methods, a monomer seed is put in a reaction vessel at a time or in parts during the course of the reaction, and according to necessity the monomer seed is dissolved in a reaction solvent such as cyclic ethers, e.g., tetrahydrofuran or 1,4-dioxane, ketones, e.g., methyl ethyl ketone, methyl isobutyl ketone or cyclohexanone, or the later-described solvents capable of dissolving the composition of the invention, e.g., propyelne glycol monomethyl ether acetate or propyelne glycol monomethyl ether, to make the monomer homogeneous. The solution is then heated, if necessary, under the inert gas atmosphere such as nitrogen or argon, and polymerization is initiated with commercially available radical polymerization initiator (e.g., azo initiators, peroxide and the like). If necessary, the initiator is further added at a time or in parts, and after completion of the reaction, the reaction system is put into a solvent, and a desired polymer is recovered as powder or solid. The reaction concentration is 10 mass % or more, preferably 15 mass % or more, and more preferably 20 mass % or more. The reaction temperature is from 10 to 150° C., preferably from 30 to 130° C., and more preferably from 50 to 100° C.

The repeating structural unit in the above specific example may be used as one kind alone, or a plurality of repeating units may be used as mixture.

Further, a resin may be used as one kind alone, or a plurality of resins may be used in combination.

The weight average molecular weight of the resin in the invention is preferably from 1,000 to 200,000 in polystyrene equivalent by the GPC method, more preferably from 3,000 to 20,000. By bringing the weight average molecular weight to the range of from 1,000 to 200,000, heat resistance, dry etching resistance, developability and film-forming property are prevented from deteriorating.

The molecular weight distribution of the resin in the invention is generally from 1 to 5, preferably from 1 to 4, and more preferably from 1 to 3. By bringing the molecular weight distribution to the range of from 1 to 5, deterioration of resolution and resist configuration, chapping of the sidewall of a resist pattern, and deterioration of roughness properties are prevented.

In the chemical amplification resist composition of the invention, the blending amount of all the resins in the entire composition is preferably from 40 to 99.99 mass % in all the solids content of the resist, more preferably from 50 to 99.97 mass %.

[2] A Compound Capable of Generating an Acid Upon Irradiation with Actinic Ray or Radiation (Component (B)):

The chemical amplification resist composition in the invention contains a compound capable of generating an acid upon irradiation with actinic ray or radiation. As such a photo-acid generator, photo-polymerization initiators of photo-cationic polymerization, photo-polymerization initiators of photo-radical polymerization, photo-decoloring agents and photo-discoloring agents of dyes, well-known compounds capable of generating an acid upon irradiation with an actinic ray or a radiation that are used in the process of micro-resist and the like, and the mixtures of these compounds can be optionally used.

For example, diazonium salt, phosphonium salt, sulfonium salt, iodonium salt, imidosulfonate, oximesulfonate, diazodisulfone, disulfone, and o-nitrobenzyl sulfonate are exemplified as photo-acid generators.

Further, compounds obtained by introducing a group or a compound capable of generating an acid upon irradiation with an actinic ray or a radiation to the main chain or the side chain of polymers, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used as photo-acid generators.

The compounds generating an acid by the action of lights as disclosed in U.S. Pat. No. 3,779,778, EP-126712 can also be used.

As the compounds decomposable upon irradiation with actinic ray or radiation and generating an acid that can be used in the invention, the compounds represented by the following formulae (ZI), (ZII) and (ZIII) can be exemplified as preferred compounds.

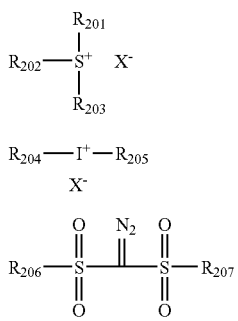

In formula (ZI), $R_{201}$, $R_{202}$ and $R_{203}$ each represents an organic group.

$X^-$ represents a non-nucleophilic anion, preferably a sulfonate anion, a carboxylate anion, bis(alkylsulfonyl)amide anion, tris(alkylsulfonyl)methide anion, $BF_4^-$, $PF_6^-$ and $SbF_6^-$ are exemplified, and preferred anions are organic anions having a carbon atom.

As preferred anions, organic anions shown below are exemplified.

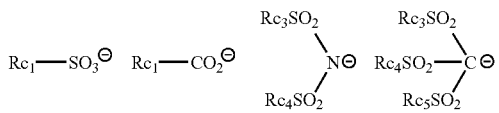

wherein $R_{c1}$ represents an organic group.

As the organic group represented by $R_{c1}$, an organic group having from 1 to 30 carbon atoms is exemplified, preferably an alkyl group, a cycloalkyl group, an aryl group, or a group obtained by linking any of these groups via a linking group, e.g., a single bond, —O—, —CO$_2$—, —S—, —SO$_3$— or —SO$_2$N(Rd$_1$)— can be exemplified.

$Rd_1$ represents a hydrogen atom or an alkyl group.

$Rc_3$, $Rc_4$ and $Rc_5$ each represents an organic group.

As the preferred organic groups represented by $Rc_3$, $Rc_4$ and $Rc_5$, the same groups as the organic groups exemplified as preferred organic groups represented by $Rc_1$ can be exemplified, and a perfluoroalkyl group having from 1 to 4 is most preferred.

$Rc_3$ and $Rc_4$ may be bonded to each other to form a ring.

The group formed by bonding $Rc_3$ and $Rc_4$, an alkylene group and an arylene group are exemplified, and a perfluoroalkylene group having from 2 to 4 carbon atoms is preferred.

The most preferred organic groups represented by $R_{c1}$, $R_{c3}$, $R_{c4}$ and $R_{c5}$ are an alkyl group substituted with a fluorine atom or a fluoroalkyl group on the 1-position, and a phenyl group substituted with a fluorine atom or a fluoroalkyl group. When the acid-generating compound is substituted with a fluorine atom or a fluoroalkyl group, the acidity of an acid generated by photo-irradiation increase to thereby improve sensitivity.

The carbon atoms of the organic groups represented by $R_{201}$, $R_{202}$ and $R_{203}$ are generally from 1 to 30, preferably from 1 to 20.

Two of $R_{201}$, $R_{202}$ and $R_{203}$ may be bonded to form a cyclic structure, and an oxygen atom, a sulfur atom, an ester bond, an amido bond and a carbonyl group may be contained in the ring. As the group formed by bonding two of $R_{201}$, $R_{202}$ and $R_{203}$, an alkylene group (e.g., a butylene group, a pentylene group) can be exemplified.

As the specific examples of the organic groups represented by $R_{201}$, $R_{202}$ and $R_{203}$, the corresponding groups in the later-described compounds represented by formula (ZI-1), (ZI-2) or (ZI-3) can be exemplified.

A compound represented by formula (ZI) may be a compound having a plurality of structures represented by formula (ZI). For instance, compound (ZI) may be a compound having a structure that at least one of $R_{201}$, $R_{202}$ and $R_{203}$ of a compound represented by formula (ZI) is bonded to at least one of $R_{201}$, $R_{202}$ and $R_{203}$ of another compound represented by formula (ZI).

The following compounds (Z1-1), (Z1-2) and (Z1-3) can be exemplified as more preferred components (ZI).

Compound (Z1-1) is a compound of formula (ZI) of the case where at least one of $R_{201}$, $R_{202}$ and $R_{203}$ represents an aryl group, that is, an arylsulfonium compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group or a cycloalkyl group.

As the arylsulfonium compounds, e.g., a triarylsulfonium compound, a diarylalkylsulfonium compound, an aryldialkyl-sulfonium compound, a diarylcycloalkylsulfonium compound, and an aryldicycloalkylsulfonium compound are exemplified.

As the aryl groups of the arylsulfonium compound, an aryl group, e.g., a phenyl group and a naphthyl group, and a hetero-aryl group, e.g., an indole residue and a pyrrole residue, are preferred, and the more preferred groups are a phenyl group and an indole residue. When the arylsulfonium compound has two or more aryl groups, these two or more aryl groups may be the same or different.

The alkyl group that the arylsulfonium compound has according to necessity is preferably a straight chain or branched alkyl group having from 1 to 15 carbon atoms e.g., a methyl group, an ethyl group, a propyl group, an n-butyl group, a sec-butyl group and a t-butyl group can be exemplified.

The cycloalkyl group that the arylsulfonium compound has according to necessity is preferably a cycloalkyl group having from 3 to 15 carbon atoms, e.g., a cyclopropyl group, a cyclobutyl group and a cyclohexyl group can be exemplified.

The aryl group, alkyl group and cycloalkyl group represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and an alkoxyl group having from 1 to 12 carbon atoms, and the most preferred substituents are an alkyl group having from 1 to 4 carbon atoms and an alkoxyl group having from 1 to 4 carbon atoms. The substituent may be substituted on any one of three of $R_{201}$, $R_{202}$ and $R_{203}$, or may be substituted on all of three. When $R_{201}$, $R_{202}$ and $R_{203}$ each represents an aryl group, it is preferred that the substituent be substituted on the p-position of the aryl group.

Compound (ZI-2) is described below.

Compound (ZI-2) is a compound of the case of formula (ZI) in which $R_{201}$ to $R_{203}$ each represents an organic group not containing an aromatic, ring. The aromatic ring also includes an aromatic ring containing a hetero atom.

The organic groups not containing an aromatic ring represented by $R_{201}$ to $R_{203}$ generally have from 1 to 30 carbon atoms, preferably from 1 to 20 carbon atoms.

$R_{201}$ to $R_{203}$ each preferably represents an alkyl group, a cycloalkyl group, an allyl group, or a vinyl group, more preferably a straight chain, branched or cyclic 2-oxoalkyl group or alkoxycarbonylmethyl group, and particularly preferably a straight or branched 2-oxoalkyl group.

The alkyl group represented by $R_{201}$ to $R_{203}$ may be either straight chain or branched, preferably a straight chain or branched alkyl group having from 1 to 10 carbon atoms (e.g., a methyl group, an ethyl group, a propyl group, a butyl group, a pentyl group) can be exemplified, more preferably a straight chain or branched oxoalkyl group and alkoxycarbonylmethyl group.

The cycloalkyl group represented by $R_{201}$ to $R_{203}$ is preferably a cycloalkyl group having from 3 to 10 carbon atoms (e.g., a cyclopentyl group, a cyclohexyl group, a norbonyl group), more preferably a cyclic 2-oxoalkyl group.

As the preferred straight chain, branched or cyclic 2-oxoalkyl group represented by $R_{201}$ to $R_{203}$, the above alkyl group and cycloalkyl group having >C=O at the 2-position can be exemplified.

As the alkoxyl group in the alkoxycarbonylmethyl group represented by $R_{201}$ to $R_{203}$, an alkoxyl group preferably having from 1 to 5 carbon atoms (e.g., a methoxy group, an ethoxy group, a propoxy group, a butoxy group, a pentoxy group) can be exemplified.

$R_{201}$ to $R_{203}$ may further be substituted with a halogen atom, an alkoxyl group (e.g., having from 1 to 5 carbon atoms), a hydroxyl group, a cyano group or a nitro group.

Compound (ZI-3) is a compound represented by the following formula (ZI-3), which compound has a phenacylsulfonium salt structure.

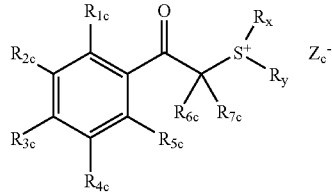

(ZI-3)

In formula (ZI-3), $R_{1c}$, $R_{2c}$, $R_{3c}$, $R_{4c}$ and $R_{5c}$ each represents a hydrogen atom, an alkyl group, a cycloalkyl group, an alkoxyl group or a halogen atom.

$R_{6c}$ and $R_{7c}$ each represents a hydrogen atom, an alkyl group or a cycloalkyl group.

$R_x$ and $R_y$ each represents an alkyl group, a cycloalkyl group, an allyl group or a vinyl group.

Any two or more of $R_{1c}$ to $R_{5c}$, $R_{6c}$ and $R_{7c}$, and $R_z$ and $R_y$ may be bonded to each other to form a cyclic structure.

$Z_c^-$ represents a non-nucleophilic anion, and the same anions as the non-nucleophilic anion represented by $X^-$ in formula (ZI) can be exemplified.

The alkyl group represented by $R_{1c}$ to $R_{7c}$ may be either straight chain or branched, e.g., a straight chain or branched alkyl group having from 1 to 20 carbon atoms, preferably from 1 to 12 carbon atoms (e.g., a methyl group, an ethyl group, a straight chain or branched propyl group, a straight chain or branched butyl group, a straight chain or branched pentyl group) can be exemplified.

As the cycloalkyl groups represented by $R_{1c}$ to $R_{7c}$, preferably a cycloalkyl group having from 3 to 8 carbon atoms (e.g., a cyclopentyl group and a cyclohexyl group) can be exemplified.

The alkoxyl groups represented by $R_{1c}$ to $R_{7c}$ may be any of straight chain, branched and cyclic, e.g., an alkoxyl group having from 1 to 10 carbon atoms, a straight chain or branched alkoxyl group having from 1 to 5 carbon atoms (e.g., a methoxy group, an ethoxy group, a straight chain or branched propoxy group, a straight chain or branched butoxy group, a straight chain or branched pentoxy group), a cyclic alkoxyl group having from 3 to 8 carbon atoms (e.g., a cyclopentyloxy group and a cyclohexyloxy group) can be exemplified.

As the groups formed by bonding any two or more of $R_{1c}$ to $R_{5c}$, $R_{6c}$ and $R_{7c}$, and $R_z$ and $R_y$, a butylene group and a pentylene group can be exemplified. These cyclic structures may contain an oxygen atom, a sulfur atom, an ester bond or an amido bond.

It is preferred that any of $R_{1c}$ to $R_{5c}$ represents a straight chain or branched alkyl group, a cycloalkyl group, or a straight chain, branched or cyclic alkoxyl group, it is more preferred that the sum total of the carbon atoms of $R_{1c}$ to $R_{5c}$ is from 2 to 15, by which the solubility in a solvent increases and generation of particles during preservation can be restrained.

The alkyl group and cycloalkyl group represented by $R_x$ and $R_y$ have the same meaning as the alkyl group and cycloalkyl group represented by $R_{1c}$ to $R_{7c}$.

$R_x$ and $R_y$ each preferably represents a 2-oxoalkyl group or an alkoxycarbonylmethyl group.

As the 2-oxoalkyl group, a group having >C=O at the 2-position of the alkyl group and cycloalkyl group represented by $R_{1c}$ and $R_{5c}$.

As the alkoxyl group of the alkoxycarbonylmethyl group, the same groups as the alkoxyl group represented by $R_{1c}$ and $R_{5c}$, can be exemplified.

$R_x$ and $R_y$ each preferably represents an alkyl group or a cycloalkyl group having 4 or more carbon atoms, more preferably an alkyl group or a cycloalkyl group having 6 or more carbon atoms, and more preferably an alkyl group or a cycloalkyl group having 8 or more carbon atoms.

In formulae (ZII) and (ZIII), $R_{204}$, $R_{205}$, $R_{206}$ and $R_{207}$ each represents an aryl group, an alkyl group or a cycloalkyl group. $X^-$ represents a non-nucleophilic anion, and the same anions as the non-nucleophilic anion represented by $X^-$ in formula (I) can be exemplified.

The aryl group represented by $R_{204}$ to $R_{207}$ is preferably a phenyl group or a naphthyl group, more preferably a phenyl group.

The alkyl group represented by $R_{204}$ to $R_{207}$ may be either straight chain or branched, and preferably a straight chain or branched alkyl group having from 1 to 10 carbon atoms (e.g., a methyl group, an ethyl group, a propyl group, a butyl group, a pentyl group) can be exemplified.

As the cycloalkyl group represented by $R_{204}$ to $R_{207}$, preferably a cycloalkyl group having from 3 to 10 carbon atoms (e.g., a cyclopentyl group, a cyclohexyl group, a norbonyl group) can be exemplified.

As the substituents that $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group, and a phenylthio group can be exemplified.

As the compounds generating an acid upon irradiation with actinic ray or radiation that can be used in the invention, the compounds represented by the following formulae (ZIV), (ZV) and (ZVI) can further be exemplified.

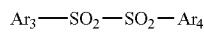

ZIV

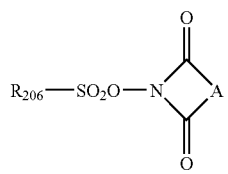

ZV

ZVI

In formulae (ZIV), (ZV) and (ZI), $Ar_3$ and $Ar_4$ each represents an aryl group.

$R_{206}$, $R_{207}$ and $R_{208}$ each represents an alkyl group, a cycloalkyl group or an aryl group.

A represents an alkylene group, an alkenylene group or an arylene group.

Of the compounds generating an acid upon irradiation with actinic ray or radiation, more preferred compounds are the compounds represented by formulae (ZI), (ZII) and (ZIII).

Of the compounds generating an acid upon irradiation with actinic ray or radiation, particularly preferred examples are shown below.

(z1)

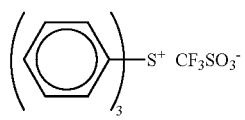

(z2)

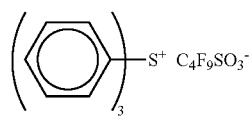

(z3)

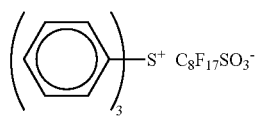

(z4)

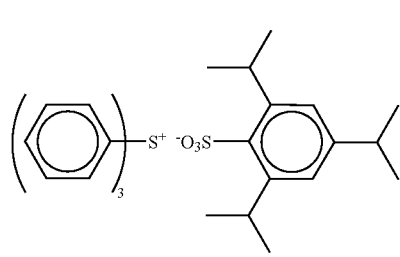

(z5)

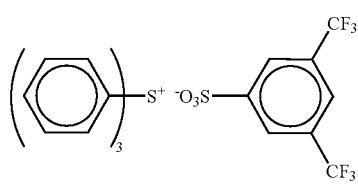

(z6)

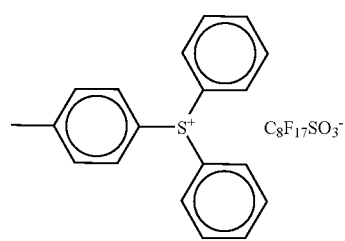

(z7)

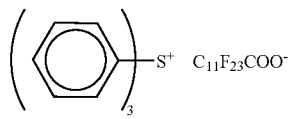

(z8)

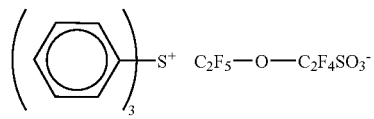

(z9)

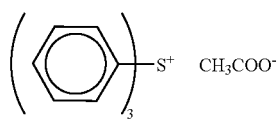

(z10)

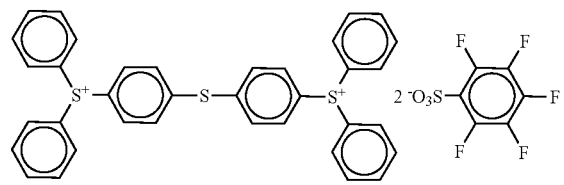

-continued
(z11) 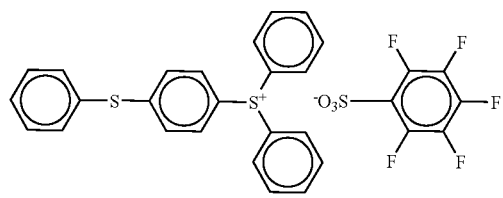
(z12) 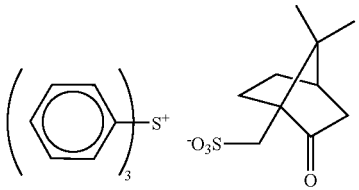
(z13) 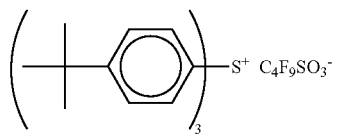
(z14) 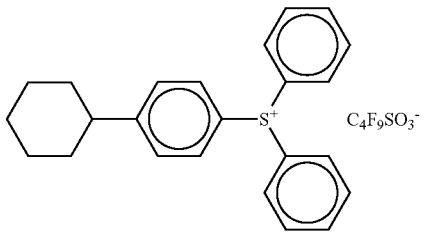
(z15) 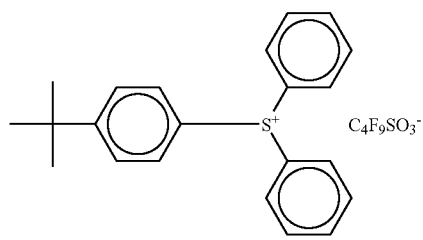
(z16) 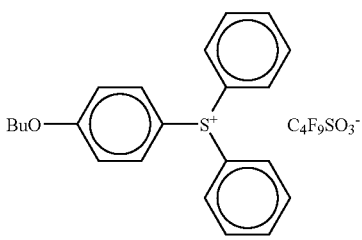
(z17) 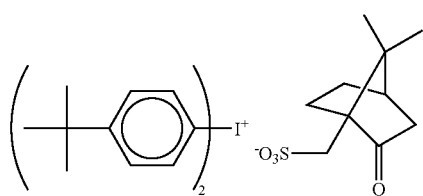
(z18) 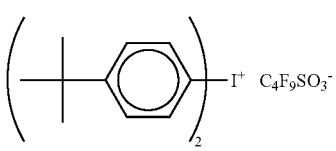
(z19) 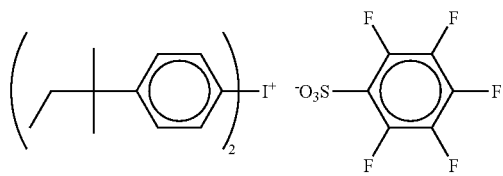
(z20) 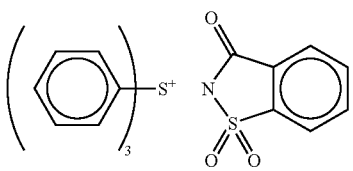
(z21) 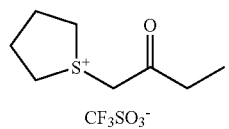
(z22) 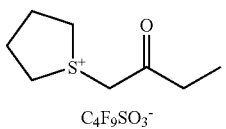
(z23) 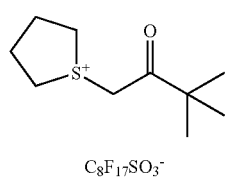
(z24) 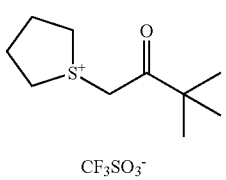
(z25) 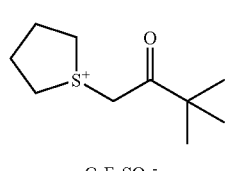
(z26) 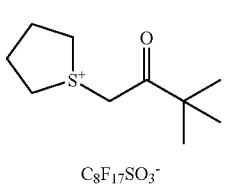

-continued
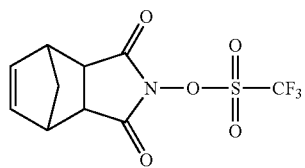
(z27)
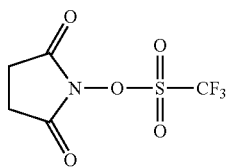
(z28)
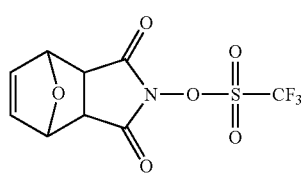
(z29)
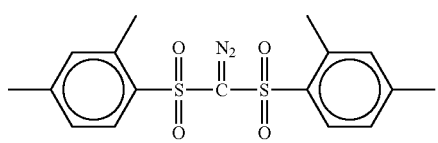
(z30)
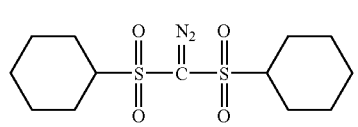
(z31)
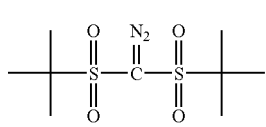
(z32)
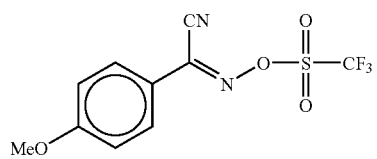
(z33)
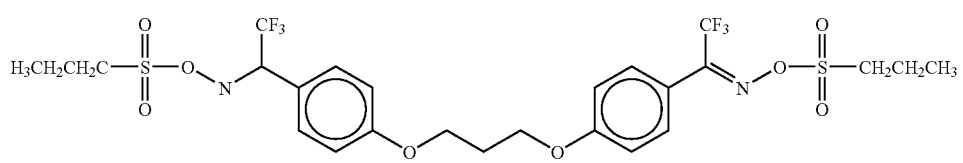
(z34)
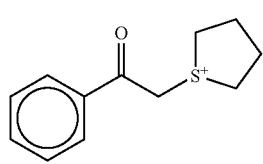
(z35)
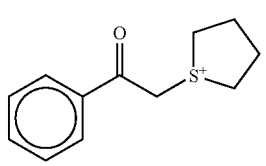
(z36)
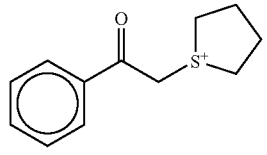
(z37)
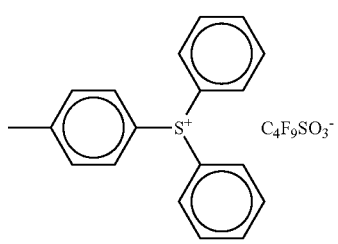
(z38)
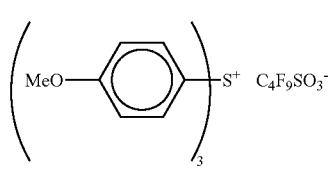
(z39)
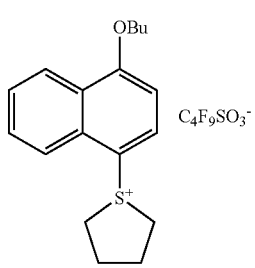
(z40)

-continued
 (z41)
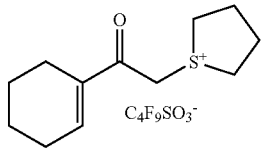 (z42)
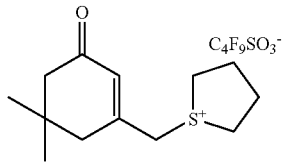 (z43)
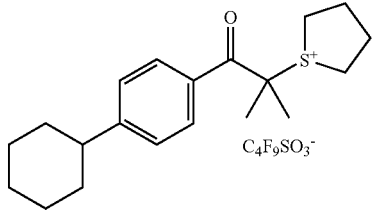 (z44)
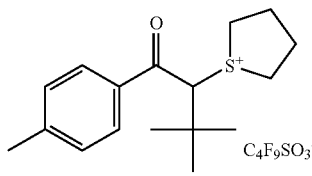 (z45)
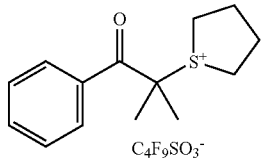 (z46)
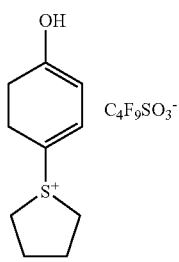 (z47)
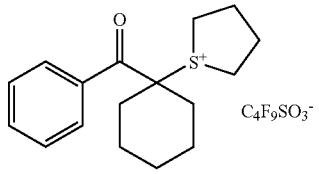 (z48)
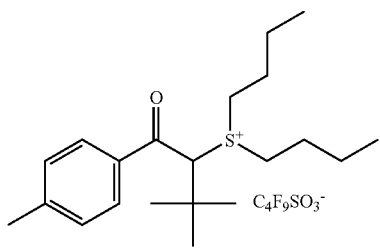 (z49)
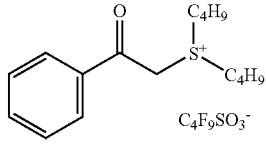 (z50)
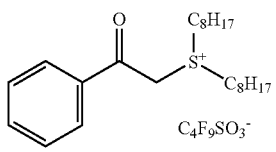 (z51)
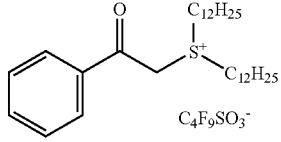 (z52)
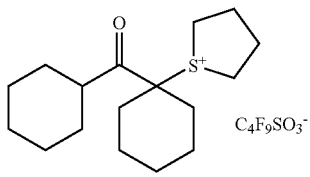 (z53)
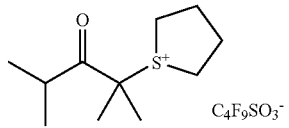 (z54)
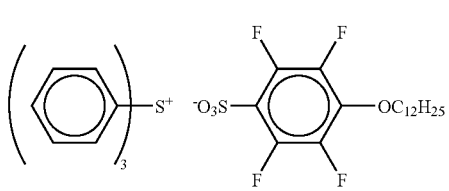 (z56)
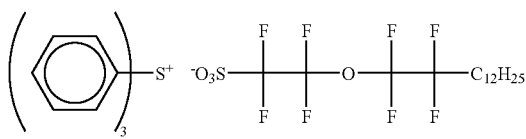 (z55)

(z57)
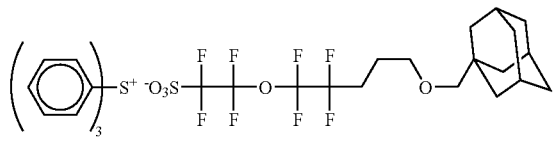

(z58)
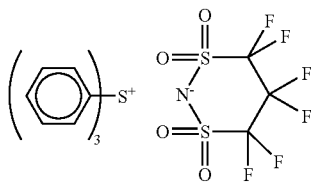

(z59)
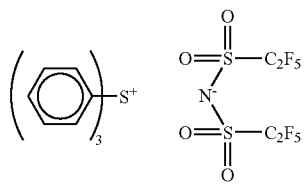

(z60)
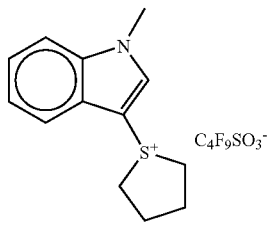

(z61)
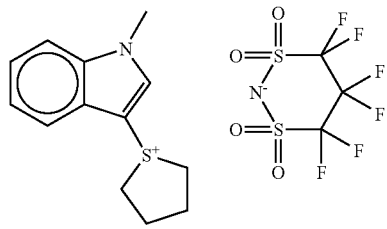

The compounds generating an acid upon irradiation with actinic ray or radiation can be used as one kind alone or two or more compounds can be used in combination.

The content of the compounds generating an acid upon irradiation with actinic ray or radiation in the chemical amplification resist composition is preferably from 0.1 to 20 mass % based on the total solids content of the resist composition, more preferably from 0.5 to 18 mass %, and still more preferably from 1.0 to 15 mass %.

[3] A Compound Having a Fluorine Atom and a Hydroxyl Group, and a pKa Value of from 4 to 15 (Component (C)):

The chemical amplification resist composition in the invention contains a compound having a fluorine atom and a hydroxyl group, and a pKa value of from 4 to 15 (hereinafter also referred to as "component (C)").

pKa is an equilibrium constant of ionization equilibrium of an acid, and shows the intensity of acid. The smaller the value, the stronger is the acid.

In general, when acid HA is in the state of ionization equilibrium, the ionization equilibrium is shown by the following equation (1), and the pKa value is given by the following equation (2).

$$HA \rightleftharpoons H^+ + A^- \quad (1)$$

$$pKa = -\log([H^+][A^-]/[HA]) \quad (2)$$

The pKa value can be computed by an analysis software of chemical structure, [ACD 5.0] (URL:http://www.acdlabs.com, by Advanced Chemistry Development Inc.), and the pKa value in the invention is a value computed according to the software.

The range of pKa of component (C) is from 4 to 15, preferably from 4.5 to 14, and more preferably from 5 to 13.5.

Component (C) is preferably a compound having a molecular weight of 1,500 or less.

Component (C) is preferably a compound represented by the following formula (FAD-I), (FAD-II) or (FAD-III) (hereinafter also referred to as component (Ca)).

(FAD-I)
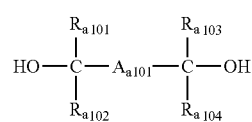

(FAD-II)
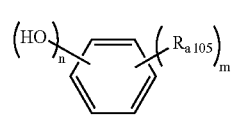

(FAD-III)
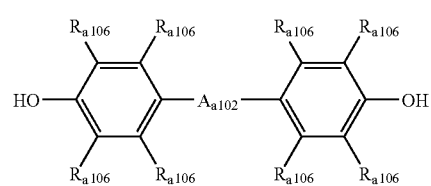

In formulae (FAD-I) to (FAD-III), $R_{a101}$, $R_{a102}$, $R_{a103}$ and $R_{a104}$ each represents a hydrogen atom, an alkyl group, an alicyclic alkyl group, an alkoxyl group, an acyl group or an acyloxy group.

$A_{a101}$, represents a perfluoroalkylene group or a perfluorocycloalkylene group.

$R_{a105}$ may be the same or different when a plurality of $R_{a105}$ are present, and each represents a fluorine atom or a perfluoroalkyl group.

n represents 1 or 2, and n+m=6.

$A_{a102}$ represents a single bond or a divalent linking group.

$R_{a106}$, which may be the same or different, each represents a fluorine atom or a perfluoroalkyl group.

The alkyl group represented by $R_{a101}$ to $R_{a104}$ in formula (FAD-I) is preferably a straight chain or branched alkyl group, e.g., a methyl group, an ethyl group, a propyl group, an n-butyl group, a sec-butyl group, a t-butyl group, a pentyl group, a hexyl group, a heptyl group, an octyl group, a nonyl group, a decyl group, a undecyl group, a dodecyl group, a tridecyl group and a tetradecyl group can be exemplified.

The alicyclic alkyl group represented by $R_{a101}$ to $R_{a104}$ is preferably an alicyclic alkyl group having from 3 to 30 carbon atoms, e.g., an adamantyl group, a noradamantyl group, a decalin group, a tricyclodecanyl group, a tetracyclododecanyl group, a norbornyl group, a cedrol group, a cyclopropyl group, a cyclopentyl group, a cyclohexyl group, a cycloheptyl group, a cyclooctyl group, a cyclodecanyl group, a cyclododecanyl group, a tetrahydrofuranyl group, a tetrahydrothienyl group, and a tetrahydropyranyl group can be exemplified. The alicyclic alkyl group represented by $R_{a101}$ to $R_{a104}$ may have a hetero atom and a functional group in the ring.

The alkoxyl group represented by $R_{a101}$ to $R_{a104}$ may be an alkyloxy group or a cycloalkyloxy group. The alkyl group in the alkoxyl group represented by $R_{a101}$ to $R_{a104}$ is preferably a straight chain or branched alkyl group having from 1 to 30 carbon atoms, e.g., a methyl group, an ethyl group, a propyl group, an n-butyl group, a sec-butyl group, a t-butyl group, a pentyl group, a hexyl group, a heptyl group, an octyl group, a nonyl group, a decyl group, a undecyl group, a dodecyl group, a tridecyl group and a tetradecyl group can be exemplified. The cycloalkyl group in the alkoxyl group represented by $R_{a101}$ to $R_{a104}$ is preferably a cycloalkyl group having from 3 to 30 carbon atoms, e.g., a cyclopropyl group, a cyclopentyl group, a cyclohexyl group, an adamantyl group, a norbornyl group and a boronyl group can be exemplified.

The acyl group represented by $R_{a101}$ to $R_{a104}$ is preferably an acyl group having from 1 to 10 carbon atoms, e.g., an acetyl group, an ethylcarbonyl group and a propylcarbonyl group can be exemplified.

The acyloxy group represented by $R_{a101}$ to $R_{a104}$ is preferably an acyloxy group having from 1 to 10 carbon atoms, e.g., an acetoxy group and an ethylcarbonyloxy group can be exemplified.

The perfluoroalkylene group represented by $A_{a101}$ is preferably a straight chain or branched perfluoroalkylene group having from 1 to 15 carbon atoms, which may have a hetero atom. The perfluorocycloalkylene group represented by $A_{a101}$ is preferably a perfluorocycloalkylene group having from 3 to 15 carbon atoms, which may have a hetero atom.

The specific examples of the perfluoroalkylene group and the perfluorocycloalkylene group represented by $A_{a101}$ are shown below, but the invention is not limited thereto.

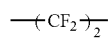
Aa-1

Aa-2

Aa-3

Aa-4

Aa-5

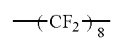
Aa-6

Aa-7

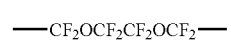
Aa-8

Aa-9

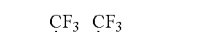
Aa-10

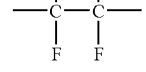
Aa-11

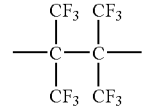
Aa-12

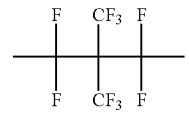
Aa-13

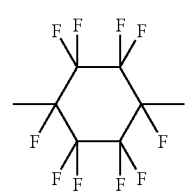

The compound represented by formula (FAD-I) is preferably represented by the following formula (FAD-Ia).

(FAD-Ia)

In formula (FAD-Ia), $A_{a101}$, represents a perfluoroalkylene group or a perfluorocycloalkylene group.

The specific examples of the compounds represented by formula (FAD-Ia) are shown below, but the invention is not limited thereto.

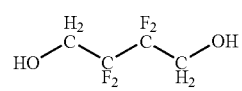
FADIa-1

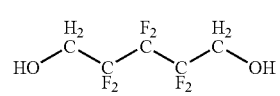
FADIa-2

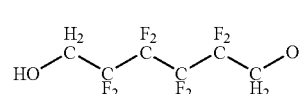
FADIa-3

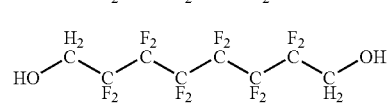
FADIa-4

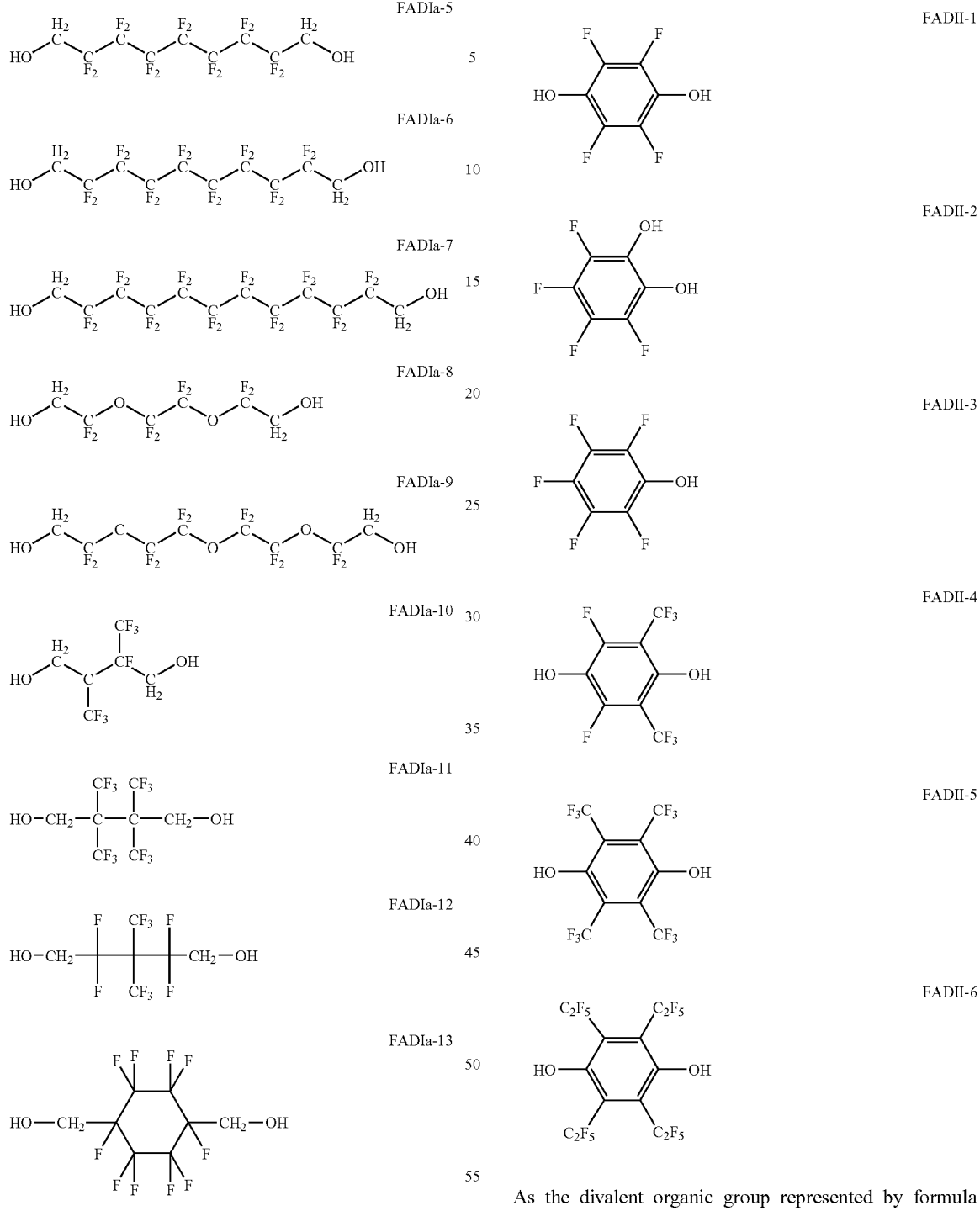

The perfluoroalkyl group represented by $R_{a105}$ in formula (FAD-II) is preferably a perfluoroalkyl group having from 1 to 20 carbon atoms, e.g., a trifluoromethyl group, a pentafluoroethyl group, a perfluoro-n-propyl group and a perfluoroisopropyl group can be exemplified.

The specific examples of the compounds represented by formula (FAD-II) are shown below, but the invention is not limited thereto.

As the divalent organic group represented by formula $A_{a102}$ in formula (FAD-III), single groups and groups bonding two or more groups of an alkylene group, an ether group, a thioether group, a carbonyl group, an ester group, an amido group, a sulfonyl group, a sulfonamido group, a urethane group and a urea group can be exemplified. The alkylene group may have a substitutent, e.g., a fluorine atom.

As the perfluoroalkyl group represented by $R_{a106}$, the same groups as the perfluoroalkyl group represented by $R_{a105}$ can be exemplified.

The specific examples of the compounds represented by formula (FAD-III) are shown below, but the invention is not limited thereto.

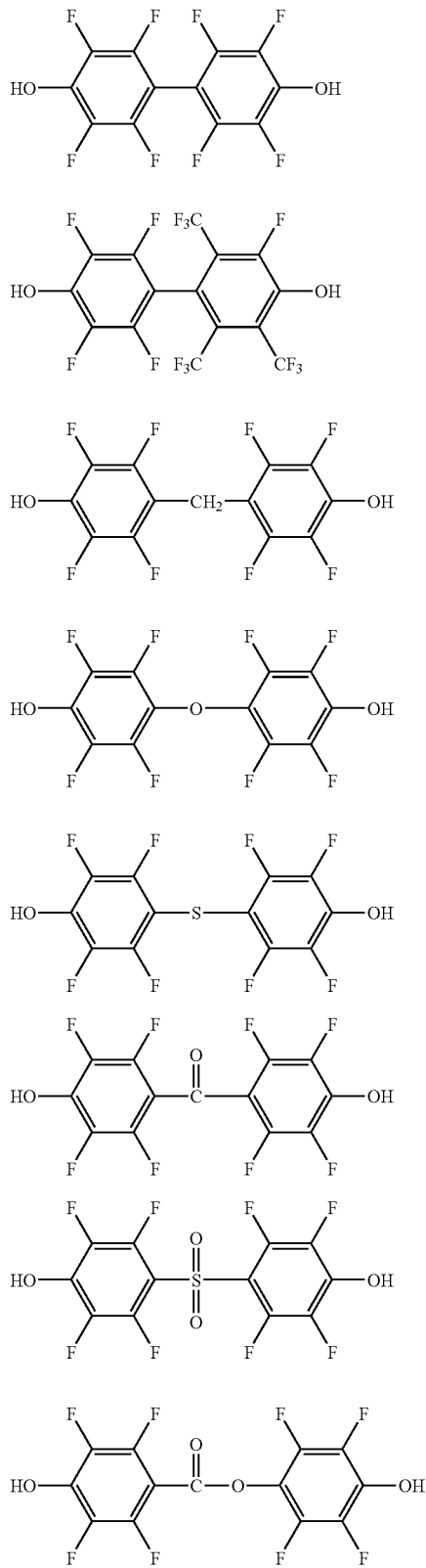

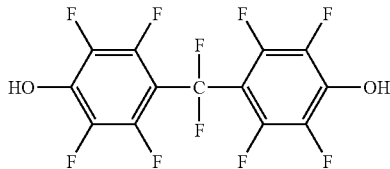

The compound represented by formula (FAD-I) can be synthesized by a reduction reaction with the corresponding ketone compound as a starting material, and converting the ketone to alcohol, as described in *Jikken Kagaku Koza (Experimental Chemistry Course)*, 4$^{th}$ Ed., Vol. 20, pp. 1 to 27. Alternatively, the compound can be synthesized by a substitution reaction with the corresponding diiodide, dibromide or dichloride as a starting material, and converting the halogen atoms other than the fluorine atom to alcohol, as described in *Jikken Kagaku Koza*, 4$^{th}$ Ed., Vol. 20, pp. 49 to 67.

The compound represented by formula (FAD-II) and the compound represented by formula (FAD-III) can be synthesized by a substitution reaction with corresponding diiodide, dibromide or dichloride as a starting material, and converting the halogen elements other than the fluorine atom to alcohol, as described in *Jikken Kagaku Koza*, 4$^{th}$ Ed., Vol. 20, pp. 114 to 121. Further, various compounds are put on the market from Wako Pure Chemical Industries, Sigma Aldrich Japan K. K., A Z max Co., etc., and so commercially available.

Compounds of components (C) and (Ca) can be used as one kind alone or in combination of two or more compounds. The content of the compounds of components (C) and (Ca) in a chemical amplification resist composition is preferably from 0.05 to 10.0 mass % based on the solids content of the composition, more preferably from 0.07 to 8.0 mass %, and still more preferably from 0.10 to 7.0 mass %.

[4] A Nitrogen-Containing Basic Compound (Component (E)):

It is preferred for the chemical amplification resist composition in the invention to contain a nitrogen-containing basic compound (component (E)). As the nitrogen-containing basic compound (component (E)), organic amine, basic ammonium salt and basic sulfonium salt are used, and it is sufficient to use compounds that do not deteriorate sublimation and resist performances.

Of these nitrogen-containing basic compounds, organic amine is preferred for being excellent in imaging property.

Basic compounds disclosed in the following patents can be used in the invention, e.g., JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-7-508840 (the term "JP-T" as used herein means a published Japanese translation of a PCT patent application), U.S. Pat. Nos. 5,525,453, 5,629,134, and 5,667,938.

As preferred nitrogen-containing basic compounds, e.g., 1,5-diazabicyclo[4.3.0]-5-nonene, 1,8-diazabicyclo[5.4.0]-7-undecene, 1,4-diazabicyclo[2.2.2]octane, 4-dimethylamino-pyridine, 1-naphthylamine, piperidine, hexamethylene-tetramine, imidazoles, hydroxypyridines, pyridines, 4,4'-diaminodiphenyl ether, pyridinium p-toluenesulfonate, 2,4,6-trimethylpyridinium p-toluenesulfonate, tetramethylammonium p-toluenesulfonate, tetrabutylammonium lactate, triethyl-amine, and tributylamine are exemplified.

Of these compounds, 1,5-diazabicyclo[4.3.0]-5-nonene, 1,8-diazabicyclo[5.4.0]-7-undecene, 1,4-diazabicyclo-[2.2.2]octane, 4-dimethylaminopyridine, 1-naphthylamine, piperidine, hexamethylenetetramine, imidazoles, hydroxypyridines, pyridines, 4,4'-diaminodiphenyl ether, organic amines such as triethylamine and tributylamine are preferred.

The content of nitrogen-containing basic compounds is generally from 0.001 to 10 mass parts per 100 mass parts of the chemical amplification resist composition (solids content), preferably from 0.001 to 5 mass parts, and more preferably from 0.001 to 0.5 mass parts.

[5] Fluorine and/or Silicon Surfactants (Component (F)):

It is preferred for the chemical amplification resist composition in the invention to further contain either one or two or more of fluorine and/or silicon surfactants (a fluorine surfactant, a silicon surfactant, a surfactant containing both a fluorine atom and a silicon atom).

By containing surfactant (F), it becomes possible for the chemical amplification resist composition in the invention to provide a resist pattern excellent in sensitivity and resolution, and low in defects in adhesion and development in using an exposure light source of 250 nm or lower, in particular, 220 nm or lower.

These surfactants (F) are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. The following commercially available surfactants can also be used as they are.

As the fluorine or silicon surfactants usable in the invention, Eftop EF301 and EF303 (manufactured by Shin-Akita Kasei Co., Ltd.), Fluorad FC 430 and 431 (manufactured by Sumitomo 3M Limited), Megafac F171, F173, F176, F189 and R08 (manufactured by Dainippon Ink and Chemicals Inc.), Sarfron S-382, SC101, 102, 103, 104, 105 and 106 (manufactured by ASAHI GLASS CO., LTD.), and Troy Sol S-366 (Troy Chemical Co., Ltd.) are exemplified. In addition, polysiloxane polymer KP-341 (manufactured by Shin-Etsu Chemical Co., Ltd.) can also be used as a silicon surfactant.

As surfactants, in addition to the above-shown well-known surfactants, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized by the method disclosed in JP-A-2002-90991.

As polymers having fluoro-aliphatic groups, copolymers of monomers having fluoro-aliphatic groups and (poly(oxyalkylene))acrylate and/or (poly(oxyalkylene))methacrylate are preferred, and these copolymers may be irregularly distributed or may be block copolymerized. As the poly-(oxyalkylene) groups, a poly(oxyethylene) group, a poly-(oxypropylene) group and poly(oxybutylene) group are exemplified. Further, the polymers may be units having alkylenes different in a chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly-(oxyalkylene)acrylate (or methacrylate) may be not only bipolymers but also terpolymers or higher polymers obtained by copolymerization of monomers having different two or more kinds of fluoro-aliphatic groups or different two or more kinds of poly(oxyalkylene)acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and (poly(oxyalkylene)) acrylate(or methacrylate), copolymers of acrylate(or methacrylate) having a $C_6F_{13}$ group, (poly(oxyethylene))acrylate (or methacrylate), and (poly-(oxypropylene))acrylate (or methacrylate), copolymers of acrylate(or methacrylate) having a $C_8F_{17}$ group and (poly-(oxyethylene))acrylate (or methacrylate), copolymers of acrylate(or methacrylate) having a $C_8F_{17}$ group, (poly(oxy-ethylene))acrylate (or methacrylate), and poly(oxypropylene)acrylate (or methacrylate) are exemplified.

The use amount of surfactants (F) is preferably from 0.0001 to 2 mass % to the total amount of the chemical amplification resist composition (excluding solvents), more preferably from 0.001 to 1 mass %.

[6] Solvent (Component (D)):

In the invention, a chemical amplification resist composition is prepared by dissolving each component in a solvent. In the invention, solvents are in a liquid state under the conditions of 25° C., 760 mmHg and have a boiling point of 250° C. or lower.

The chemical amplification resist composition in the invention can use as solvent (component D) a single solvent or a mixed solvent. As the single solvent, alkyl lactate or propylene glycol monoalkyl ether carboxylate is preferred. As the mixed solvent, mixed solvents comprising at least two solvents selected from the group consisting of propylene glycol monoalkyl ether carboxylate, propylene glycol monoalkyl ether, cyclohexanone and alkyl lactate are preferred, and mixed solvents comprising at least one kind of solvent selected from the group consisting of propylene glycol monoalkyl ether carboxylate and alkyl lactate (also referred to as the solvent of group A), and at least one kind of solvent selected from the group consisting of propylene glycol monoalkyl ether and cyclohexanone (also referred to as the solvent of group B), and a mixed solvent comprising propylene glycol monoalkyl ether carboxylate and alkyl lactate are more preferred.

As the propylene glycol monoalkyl ether carboxylate, propylene glycol monomethyl ether acetate, propylene glycol monomethyl ether propionate, propylene glycol monoethyl ether acetate, and propylene glycol monoethyl ether propionate are preferably exemplified.

As the propylene glycol monoalkyl ether, propylene glycol monomethyl ether and propylene glycol monoethyl ether are preferably exemplified.

As the alkyl lactate, methyl lactate and ethyl lactate are preferably exemplified.

The mass ratio of the use amount of the solvent of group A and the solvent of group B (A/B) is preferably from 90/10 to 15/85, more preferably from 85/15 to 20/80, and still more preferably from 80/20 to 25/75.

The mass ratio of the use amount of propylene glycol monoalkyl ether carboxylate and alkyl lactate (propylene glycol monoalkyl ether carboxylate/alkyl lactate) is preferably from 90/10 to 10/90, more preferably from 85/15 to 15/85, and still more preferably from 80/20 to 20/80.

In the invention, it is preferred that the solids content of the composition containing above each component is dissolved in the above mixed solvent in solid concentration of from 3 to 25 mass %, more preferably from 5 to 22 mass %, and still more preferably from 7 to 20 mass %.

Preferred combinations of the mixed solvents in the invention are as follows:

Propylene glycol monomethyl ether acetate+propylene glycol monomethyl ether,
Propylene glycol monomethyl ether acetate+propylene glycol monoethyl ether,
Propylene glycol monomethyl ether acetate+cyclohexanone,
Propylene glycol monomethyl ether acetate+ethyl lactate,
Propylene glycol monomethyl ether acetate+methyl lactate,
Propylene glycol monomethyl ether propionate+propylene glycol monomethyl ether,
Propylene glycol monomethyl ether propionate+propylene glycol monoethyl ether,
Propylene glycol monomethyl ether propionate+cyclohexanone,
Propylene glycol monomethyl ether propionate+ethyl lactate,
Propylene glycol monomethyl ether propionate+methyl lactate,
Propylene glycol monoethyl ether acetate+propylene glycol monomethyl ether,
Propylene glycol monoethyl ether acetate+propylene glycol monoethyl ether,
Propylene glycol monoethyl ether acetate+cyclohexanone,
Propylene glycol monoethyl ether acetate+ethyl lactate,
Propylene glycol monoethyl ether acetate+methyl lactate,
Propylene glycol monoethyl ether propionate+propylene glycol monomethyl ether,
Propylene glycol monoethyl ether propionate+propylene glycol monoethyl ether,
Propylene glycol monoethyl ether propionate+cyclohexanone,
Propylene glycol monoethyl ether propionate+ethyl lactate,
Propylene glycol monoethyl ether propionate+methyl lactate,
Ethyl lactate+propylene glycol monomethyl ether,
Ethyl lactate+propylene glycol monoethyl ether,
Methyl lactate+propylene glycol monomethyl ether,
Methyl lactate+propylene glycol monoethyl ether,
Ethyl lactate+cyclohexanone, and
Methyl lactate+cyclohexanone.

Of these combinations, particularly preferred combinations of the solvents are as follows:

Propylene glycol monomethyl ether acetate+propylene glycol monomethyl ether,
Propylene glycol monomethyl ether acetate+cyclohexanone,
Propylene glycol monomethyl ether acetate+ethyl lactate, and
Ethyl lactate+propylene glycol monomethyl ether.

Other solvents may be added to these mixed solvents. The addition amount of other solvents is 30 mass parts or less per 100 mass parts of the mixed solvents of the invention. As other solvents, e.g., ethylene dichloride, cyclopentanone, methyl ethyl ketone, γ-butyrolactone, ethylene carbonate, propylene carbonate, toluene, N,N-dimethylformamide, dimethyl sulfoxide, N-methylpyrrolidone, and tetrahydrofuran are exemplified.

The chemical amplification resist composition in the invention can contain, if necessary, a low molecular weight acid-decomposable compound having a molecular weight of 2,000 or less containing an acid-decomposable group and being capable of increasing the alkali solubility by the action of an acid.

As these low molecular weight acid-decomposable compounds, for example, alicyclic compounds, e.g., acid-decomposable group-containing cholic acid derivatives, dehydrochloric acid derivatives, deoxychloric acid derivatives, lithocholic acid derivatives, ursocholic acid derivatives, and abietic acid derivatives, and aromatic compounds, e.g., naphthalene derivatives having an acid-decomposable group as described in *Proc. SPIE*, 2724, 355 (1996), JP-A-8-15865, U.S. Pat. No. 5,372,912, *J. Photopolym. Sci. Tech.*, Vol. 10, No. 3, 511 (1997) can be used.

Further, the low molecular weight acid-decomposable dissolution-inhibiting compounds disclosed in JP-A-6-51519 can be used in the addition range of not deteriorating the transmission at 220 nm, and 1,2-naphthoquinonediazide compounds can also be used.

When the low molecular weight acid-decomposable dissolution-inhibiting compounds are used in the resist composition in the invention, the content is generally from 0.5 to 50 mass parts per 100 mass parts (solids content) of the resist composition, preferably from 0.5 to 40 mass parts, more preferably from 0.5 to 30 mass parts, and particularly preferably from 0.5 to 20.0 mass parts.

When the low molecular weight acid-decomposable dissolution-inhibiting compounds are added, not only development defect is improved but also dry etching resistance is heightened.

The chemical amplification resist composition in the invention can further contain, if necessary, a dissolution accelerating compound in a developing solution, a halation-preventing agent, a plasticizer, a surfactant, a photo-sensitizer, an adhesion assistant, a crosslinking agent and a photobase generator, etc.

As the examples of the dissolution-accelerating compounds in a developing solution that can be used in the invention, e.g., low molecular weight compounds having a molecular weight of 1,000 or less, such as compounds having two or more phenolic hydroxyl groups, compounds having one or more naphthols, e.g., 1-naphthol, or carboxyl groups, carboxylic anhydride, sulfonamide compounds and sulfonylimide compounds as disclosed in JP-A-3-206458 can be exemplified.

The blending amount of these dissolution-accelerating compounds is preferably 30 mass % or less based on the total mass (solids content) of the composition, more preferably 20 mass % or less.

As halation-preventing agents, compounds that absorb efficiently the radiation irradiated are preferred, and substituted benzenes, e.g., fluorenone, 9-fluorenone, benzophenone; and polycyclic aromatic compounds, e.g., anthracene, anthracene-9-methanol, anthracene-9-carboxyethyl, phenanthrene, perylene and azirene are exemplified. Polycyclic aromatic compounds are particularly preferred. These halation-preventing agents exhibit the effect of the improvement of standing wave by reducing the reflected light from a substrate and lessening the influence of multiple-reflection in a resist film.

The resist composition in the invention can contain a photo-sensitizer for the improvement of acid generating rate by exposure. As preferred photo-sensitizers, benzophenone, p,p'-tetramethyldiaminobenzophenone, 2-chlorothioxanthone, anthrone, 9-ethoxyanthracene, pyrene, phenothiazine, benzyl, benzoflavin, acetophenone, phenanthrene, benzoquinone, anthraquinone and 1,2-naphthoquinone can be exemplified, but photo-sensitizers are not limited thereto. These photo-sensitizers can also be used as the halation-preventing agents.

The chemical amplification resist composition in the invention is coated on a prescribed support as follows.

That is, the chemical amplification resist composition is coated on a substrate (e.g., silicon/silicon dioxide coating) as used in the manufacture of a precision integrated circuit element by an appropriate coating method, e.g., with a spinner or a coater, and heated to form a resist film.

Subsequently, the resist film is subjected to exposure through a prescribed mask, heating and development. Thus, a good resist pattern can be obtained. Here, as exposure light, far ultraviolet rays having wavelengths of 250 nm or less, preferably 220 nm or less. Specifically, a KrF excimer laser (248 nm), an ArF excimer laser (193 nm), an F2 excimer layer (157 nm), an X-ray and an electron beam are exemplified.

As the alkali developer of the chemical amplification resist composition, alkaline aqueous solutions of inorganic alkalis, e.g., sodium hydroxide, potassium hydroxide, sodium carbonate, sodium silicate, sodium metasilicate and aqueous ammonia, primary amines, e.g., ethylamine and n-propylamine, secondary amines, e.g., diethylamine and di-n-butylamine, tertiary amines, e.g., triethylamine and methyldiethylamine, alcohol amines, e.g., dimethylethanolamine and triethanolamine, quaternary ammonium salts, e.g., tetramethylammonium hydroxide and tetraethylammonium hydroxide, and cyclic amines, e.g., pyrrole and piperidine, can be used.

An appropriate amount of alcohols and surfactants may be added to these alkaline aqueous solutions.

The alkali concentration of alkali developers is generally from 0.1 to 20 mass %.

The pH of alkali developers is generally from 10.0 to 15.0.

EXAMPLE

The invention will be described more specifically with referring to examples, but the invention is not limited thereto.

Synthesis Example 1

Synthesis of Resin (1)

2-Methyl-2-adamantyl methacrylate and butyrolactone methacrylate in proportion of 55/45 (in molar ratio) were dissolved in methyl ethyl ketone/tetrahydrofuran (5/5) to prepare 100 ml of a solution having solid concentration of 20 mass %. As a polymerization initiator, 2 mol % of V-65 (manufactured by Wako Pure Chemical Industries Ltd.) was added to the solution, and the mixed solution was dripped to 10 ml of methyl ethyl ketone heated at 60° C. for 4 hours in a nitrogen atmosphere. After completion of dripping, the reaction solution was heated for 4 hours, 1 mol % of V-65 was added again, and the reaction solution was stirred for 4 hours. After termination of the reaction, the temperature of the reaction solution was lowered to room temperature, and the reaction solution was crystallized in 3 liters of a mixed solvent of distilled water/isopropyl alcohol (1/1 by mass), thus precipitated resin (1) having the structure shown below was recovered as white powder.

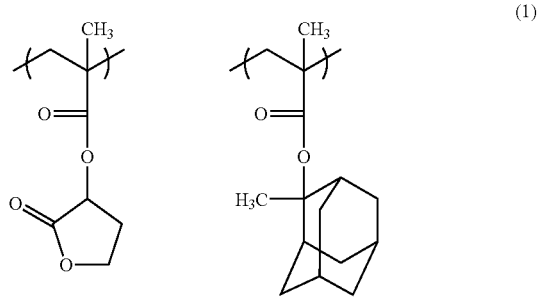

The polymer composition ratio found by $^{13}$C-NMR was 46/54 from $^{13}$NMR. The weight average molecular weight of the resin calculated in standard polystyrene equivalent by GPC measurement was 10,700.

Resins (2) to (23) were synthesized in the same manner as in Synthesis Example 1.

The structures of resins (2) to (23) are shown below.

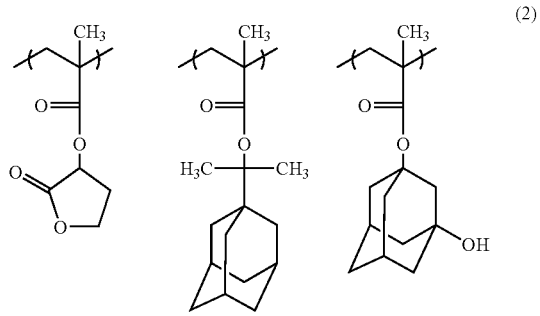

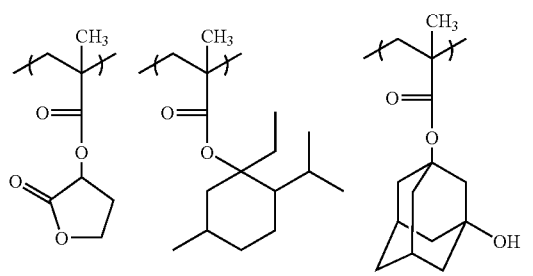

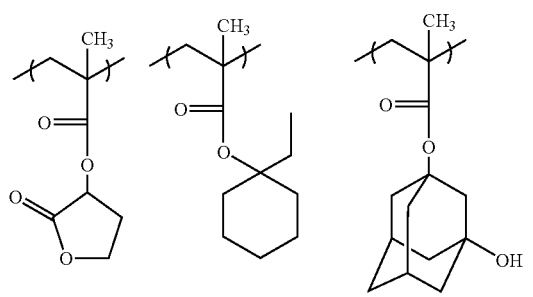

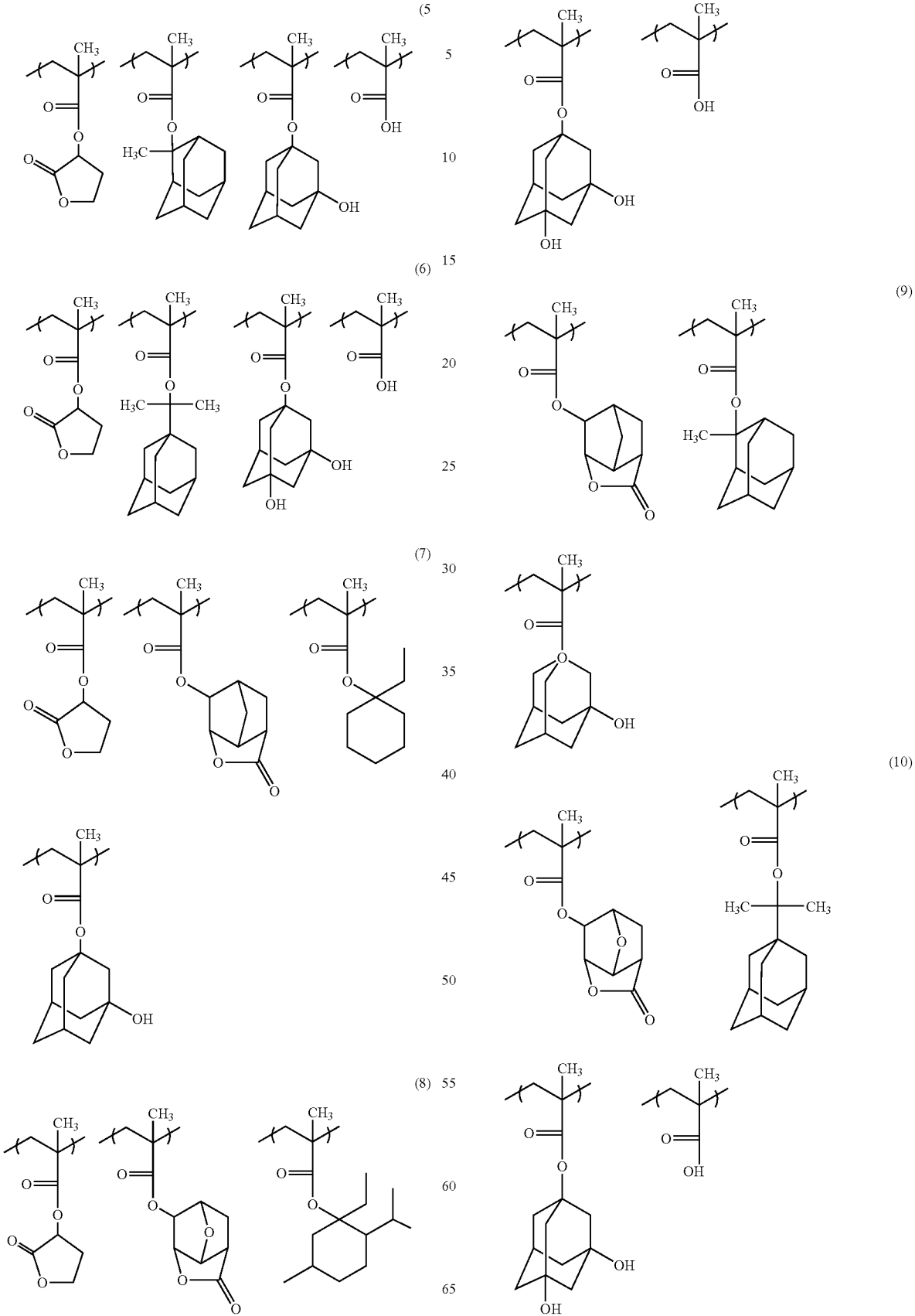

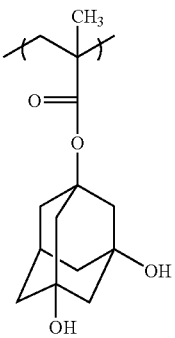
(11)
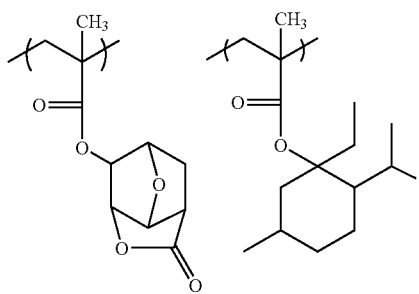
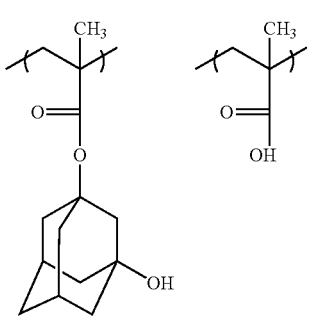
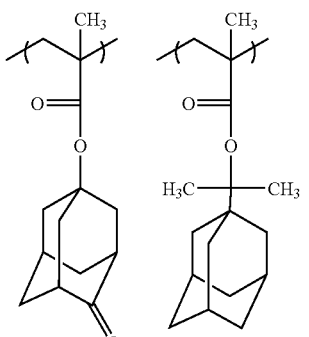
(14)
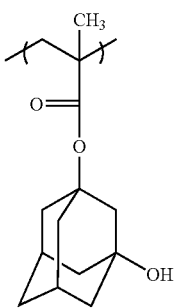
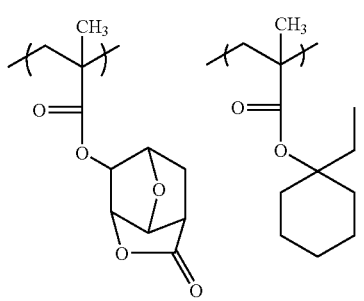
(12)
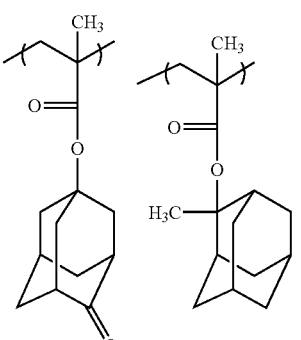
(15)
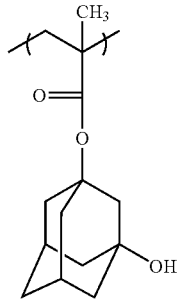
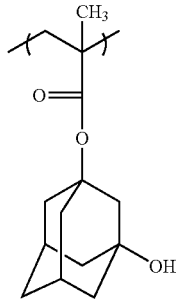
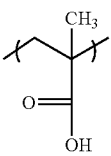
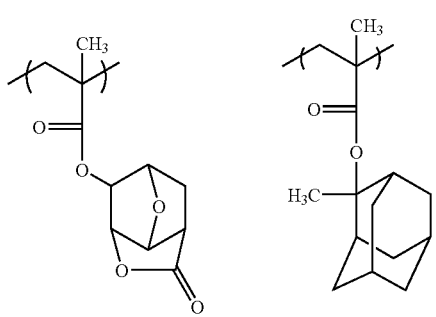
(13)
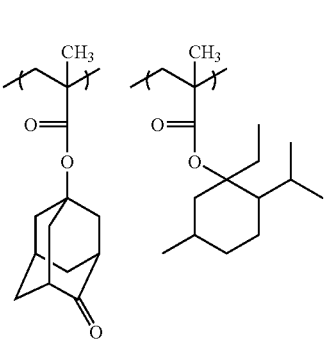
(16)

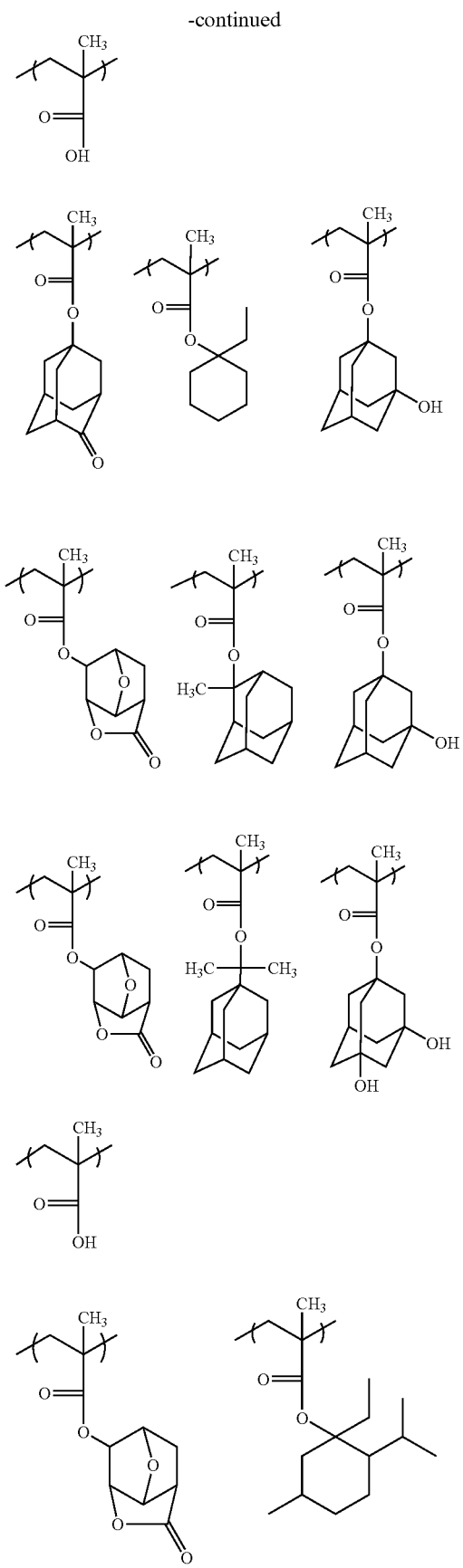
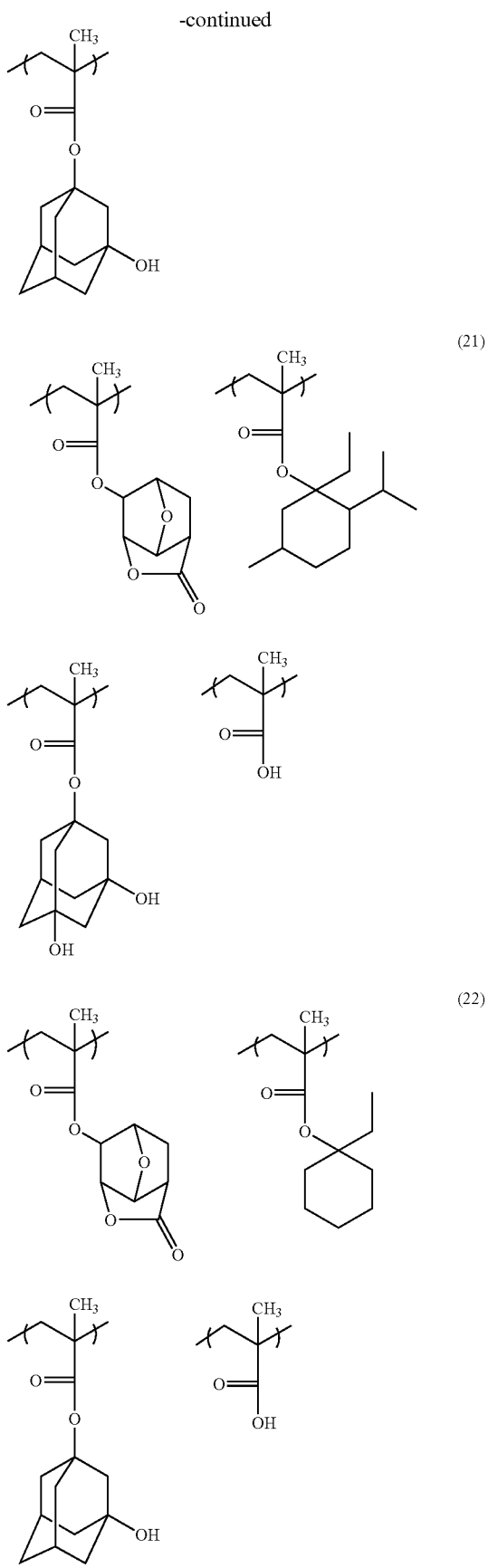

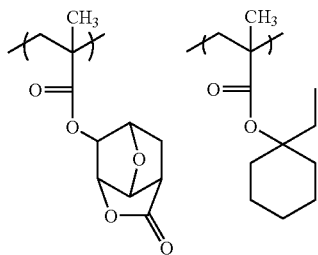 (23) 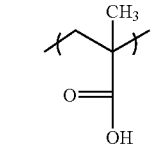

The composition ratio and the weight average molecular weight of each of resins (2) to (23) are shown in Table 1 below. (The repeating units 1, 2, 3 and 4 mean the order from the left side of the structural formulae.)

TABLE 1

| Resin | Repeating Unit 1 (mol %) | Repeating Unit 2 (mol %) | Repeating Unit 3 (mol %) | Repeating Unit 4 (mol %) | Repeating Unit 5 (mol %) | Molecular Weight |
|---|---|---|---|---|---|---|
| 2 | 41 | 40 | 19 | — | — | 11,000 |
| 3 | 35 | 45 | 20 | — | — | 10,000 |
| 4 | 38 | 39 | 23 | — | — | 10,500 |
| 5 | 35 | 35 | 18 | 12 | — | 11,500 |
| 6 | 38 | 30 | 21 | 11 | — | 12,500 |
| 7 | 21 | 25 | 35 | 19 | — | 12,000 |
| 8 | 18 | 22 | 35 | 15 | 10 | 12,500 |
| 9 | 35 | 48 | 17 | — | — | 11,500 |
| 10 | 32 | 35 | 22 | 11 | — | 10,000 |
| 11 | 33 | 39 | 22 | 6 | — | 9,500 |
| 12 | 35 | 43 | 22 | — | — | 12,000 |
| 13 | 38 | 42 | 20 | — | — | 11,500 |
| 14 | 33 | 45 | 22 | — | — | 11,000 |
| 15 | 31 | 41 | 19 | 9 | — | 12,500 |
| 16 | 36 | 36 | 18 | 10 | — | 9,500 |
| 17 | 34 | 48 | 18 | — | — | 11,000 |
| 18 | 32 | 45 | 23 | — | — | 10,500 |
| 19 | 48 | 28 | 18 | 6 | — | 9,500 |
| 20 | 42 | 42 | 16 | — | — | 9,500 |
| 21 | 28 | 38 | 24 | 10 | — | 10,000 |
| 22 | 38 | 31 | 19 | 12 | — | 10,500 |
| 23 | 25 | 38 | 29 | 8 | — | 13,000 |

Examples 1 to 39 and Comparative Examples 1 to 3

Preparation and Evaluation of Chemical Amplification Resist Composition:

The chemical amplification resist compositions in Examples 1 to 39 and Comparative Examples 1 to 3 were prepared by blending 1.03 g of the resin, 0.00035 mol of the acid generator, 16.5 mg of the compound of component (C), 0.00010 mol of the nitrogen-containing basic compound, and 100 ppm of the total composition of the surfactant, as shown in Table 2 below. Each composition was dissolved in the solvent shown in Table 2 so that the solids content became 10 mass %, and filtered through a micro-filter of 0.1 μm meshes.

TABLE 2

| Ex. No. | Resin | Acid Generator | Component (C) (pKa) | Nitrogen-Containing Basic Compound | Surfactant | Solvent | Number of Development Defect | Pattern Collapse (nm) | Profile |
|---|---|---|---|---|---|---|---|---|---|
| Ex. 1 | 1 | z3 | FAD-Ia-1 (12.83) | N-5 | W-2 | S-1 | 2 | 61 | ○ |
| Ex. 2 | 1 | z3 | FAD-Ia-2 (12.68) | N-5 | W-2 | S-1 | 5 | 65 | ○ |
| Ex. 3 | 1 | z3 | FAD-Ia-3 (12.62) | N-5 | W-2 | S-1 | 1 | 63 | ○ |
| Ex. 4 | 1 | z3 | FAD-Ia-4 (12.59) | N-5 | W-2 | S-1 | 3 | 60 | ○ |
| Ex. 5 | 1 | z3 | FAD-Ia-5 (12.59) | N-5 | W-2 | S-1 | 3 | 65 | ○ |
| Ex. 6 | 1 | z3 | FAD-Ia-6 (12.59) | N-5 | W-2 | S-1 | 6 | 62 | ○ |
| Ex. 7 | 1 | z3 | FAD-Ia-7 (12.58) | N-5 | W-2 | S-1 | 2 | 66 | ○ |
| Ex. 8 | 1 | z3 | FAD-Ia-8 (12.86) | N-5 | W-2 | S-1 | 5 | 62 | ○ |
| Ex. 9 | 1 | z3 | FAD-Ia-9 (12.84) | N-5 | W-2 | S-1 | 2 | 61 | ○ |
| Ex. 10 | 1 | z3 | FAD-II-1 (5.90) | N-5 | W-2 | S-1 | 7 | 69 | ○ |
| Ex. 11 | 1 | z3 | FAD-II-3 (5.50) | N-5 | W-2 | S-1 | 7 | 71 | ○ |
| Ex. 12 | 1 | z3 | FAD-II-3 (12.62) | N-5 | W-2 | S-2 | 1 | 63 | ○ |
| Ex. 13 | 1 | z3 | FAD-Ia-3 (12.62) | N-5 | W-2 | S-4 | 3 | 72 | ○ |
| Ex. 14 | 2 | z3 | FAD-Ia-3 (12.62) | N-5 | W-2 | S-1/S-2 = 5/5 | 2 | 61 | ○ |
| Ex. 15 | 2 | z3 | FAD-Ia-3 (12.62) | N-5 | W-2 | S-1/S-3 = 6/4 | 2 | 60 | ○ |
| Ex. 16 | 2 | z2 | FAD-Ia-3 (12.62) | N-5 | W-2 | S-1/S-4 = 7/3 | 4 | 63 | ○ |
| Ex. 17 | 2 | z6 | FAD-Ia-3 (12.62) | N-5 | W-2 | S-2/S-3 = 6/4 | 2 | 65 | ○ |
| Ex. 18 | 2 | z13 | FAD-Ia-3 (12.62) | N-5 | W-2 | S-2/S-4 = 7/3 | 1 | 62 | ○ |
| Ex. 19 | 3 | z40 | FAD-Ia-3 (12.62) | N-6 | W-1 | S-1/S-4 = 7/3 | 1 | 62 | ○ |
| Ex. 20 | 4 | z38 | FAD-Ia-3 (12.62) | N-1 | W-4 | S-1/S-4 = 6/4 | 4 | 61 | ○ |
| Ex. 21 | 5 | z59 | FAD-Ia-3 (12.62) | N-3 | W-2 | S-1/S-4 = 7/3 | 3 | 63 | ○ |
| Ex. 22 | 6 | z56 | FAD-Ia-3 (12.62) | N-4 | W-3 | S-1/S-4 = 7/3 | 3 | 60 | ○ |
| Ex. 23 | 7 | z8 | FAD-Ia-3 (12.62) | N-4 | W-3 | S-1/S-4 = 6/4 | 6 | 65 | ○ |
| Ex. 24 | 8 | z55 | FAD-Ia-3 (12.62) | N-6 | W-2 | S-1/S-4 = 7/3 | 5 | 65 | ○ |
| Ex. 25 | 9 | z58 | FAD-Ia-3 (12.62) | N-7 | W-4 | S-1/S-4 = 6/4 | 2 | 62 | ○ |
| Ex. 26 | 10 | z14 | FAD-Ia-3 (12.62) | N-7 | W-1 | S-1/S-4 = 6/4 | 4 | 63 | ○ |
| Ex. 27 | 11 | z16 | FAD-Ia-3 (12.62) | N-2 | W-4 | S-1/S-4 = 7/3 | 2 | 61 | ○ |
| Ex. 28 | 12 | z56 | FAD-Ia-3 (12.62) | N-1 | W-4 | S-1/S-4 = 6/4 | 1 | 61 | ○ |
| Ex. 29 | 13 | z56 | FAD-Ia-3 (12.62) | N-3 | W-3 | S-1/S-4 = 7/3 | 2 | 61 | ○ |
| Ex. 30 | 14 | z58 | FAD-Ia-3 (12.62) | N-1 | W-4 | S-1/S-4 = 7/3 | 4 | 63 | ○ |
| Ex. 31 | 15 | z14 | FAD-Ia-3 (12.62) | N-5 | W-4 | S-1/S-4 = 6/4 | 3 | 64 | ○ |
| Ex. 32 | 16 | z39 | FAD-Ia-3 (12.62) | N-3 | W-2 | S-1/S-4 = 6/4 | 5 | 62 | ○ |
| Ex. 33 | 17 | z38 | FAD-Ia-3 (12.62) | N-1 | W-1 | S-1/S-4 = 7/3 | 1 | 63 | ○ |
| Ex. 34 | 18 | z46 | FAD-Ia-3 (12.62) | N-4 | W-1 | S-1/S-4 = 6/4 | 1 | 62 | ○ |
| Ex. 35 | 19 | z6 | FAD-Ia-3 (12.62) | N-6 | W-3 | S-1/S-4 = 7/3 | 3 | 61 | ○ |
| Ex. 36 | 20 | z3 | FAD-Ia-3 (12.62) | N-4 | W-2 | S-1/S-4 = 6/4 | 0 | 63 | ○ |
| Ex. 37 | 21 | z3 | FAD-Ia-3 (12.62) | N-2 | W-1 | S-1/S-4 = 7/3 | 6 | 66 | ○ |
| Ex. 38 | 22 | z58 | FAD-Ia-3 (12.62) | N-4 | W-3 | S-1/S-4 = 6/4 | 0 | 62 | ○ |
| Ex. 39 | 23 | z16 | FAD-Ia-3 (12.62) | N-7 | W-1 | S-1/S-4 = 7/3 | 4 | 61 | ○ |
| Comp. 1 | 1 | z3 | — | N-5 | W-2 | S-1 | 23 | 75 | x |
| Comp. 2 | 10 | z14 | — | N-7 | W-1 | S-1/S-4 = 6/4 | 36 | 96 | Δ |
| Comp. 3 | 18 | z46 | — | N-1 | W-1 | S-1/S-4 = 6/4 | 31 | 75 | Δ |

The abbreviations in Table 2 are as follows.

As the nitrogen-containing basic compounds:
N-1: 1,5-Diazabicyclo[4.3.0]-5-nonene
N-2: 1,8-Diazabicyclo[5.4.0]-7-undecene
N-3: 4-Dimethylaminopyridine
N-4: N,N-Di(2-hydroxyethyl)aniline
N-5: Diisopropylaniline
N-6: Tributylamine
N-7: Trioctylamine As the surfactants:
W-1: Megafac F176 (fluorine surfactant, manufactured by Dainippon Ink and Chemicals Inc.)
W-2: Megafac R08 (fluorine and silicon surfactant, manufactured by Dainippon Ink and Chemicals Inc.)
W-3: Polysiloxane polymer KP-341 (manufactured by Shin-Etsu Chemical Co., Ltd.)
W-4: Troy Sol S-366 (manufactured by Troy Chemical Co., Ltd.)

As the solvents:
S-1: Propylene glycol monomethyl ether acetate
S-2: Ethyl lactate
S-3: Cyclohexanone
S-4: Propylene glycol monomethyl ether As the compounds of component (C), commercially available products by AZ max Co. were used.

The pKa values of the compounds of component (C) were computed by analysis software of chemical structure, [ACD 5.0].

Methods of Evaluation:

(1) Evaluation of the Suppression of Pattern Collapse

An anti-reflecting, film DUV-42 (manufactured by Brewer Science) was uniformly coated in a thickness of 600 Å on a silicone substrate treated with hexamethyldisilazane by a spin coater and dried at 100° C. for 90 seconds on a hot plate, and further dried by heating at 190° C. for 240 seconds. After that, each chemical amplification resist composition was coated thereon by a spin coater and dried at 120° C. for 90 seconds, whereby a resist film having a thickness of 0.30 μm was formed. The resist film was subjected to exposure through a mask with an ArF excimer laser stepper (NA=0.60, 0.60/0.80 Annular Illumination, manufactured by ISI), and the exposed resist film was heated on a hot plate at 120° C. for 90 seconds immediately after exposure. The resist film was further developed with a 2.38 mass % tetramethylammonium hydroxide aqueous solution at 23° C. for 60 seconds, rinsed with pure water for 30 seconds, and then dried, thus a line pattern was obtained. The mask pattern of continuous 15 lines of line and space of 1/1 was evaluated. The measurement of line width was started from the exposure amount to reproduce a mask pattern of line and space of 1/1 of 0.13 μm, and the time when at least one line of the most central five lines collapsed by varying the exposure amount was taken as the starting point of pattern collapse. The line width just before the starting point of pattern collapse (the limit to leave the most central five lines not collapsed) was taken as the critical line width of pattern collapse.

(2) Evaluation of Development Defect

The number of development defect of the above repeating pattern obtained in the above evaluation of pattern collapse was measured with KLA 2112 tester (manufactured by KLA Tencor Japan) (threshold: 12, pixel size: 0.39).

(3) Evaluation of Profile

The rectangular property of each pattern was evaluated by observing the cross sectional profile of the pattern reproduced a mask pattern of line and space of 1/1 of 0.13 μm in the evaluation of the suppressing effect of pattern collapse with a scanning electron microscope (model S4300, manufactured by Hitachi, Ltd.) on the conditions of accelerating voltage of 20 kV, emission electric current of 5 μA, and by 80,000 magnifications. A pattern having a good rectangular form was graded ○, a pattern having a rectangular form of not so good was graded Δ, and bad rectangular form was graded ×.

The results of evaluations are shown in Table 2.

From the results in Table 2, it is apparently seen that the chemical amplification resist compositions according to the invention are extremely few in development defect, and excellent in the suppressing effect of pattern collapse and the profile.

This application is based on Japanese patent applications JP 2004-238040, filed on Aug. 18, 2004, the entire content of which is hereby incorporated by reference, the same as if set forth at length.

What is claimed is:

1. A chemical amplification resist composition comprising: (A) a resin increasing the solubility in an alkali developer by the action of an acid; (B) a compound capable of generating an acid upon irradiation with actinic ray or radiation; (C) a compound having a fluorine atom and a hydroxyl group, and a pKa value of from 4 to 15; and (D) a solvent, wherein compound (C) includes (Ca) a compound represented by the following formula (FAD-I) or (FAD-III):

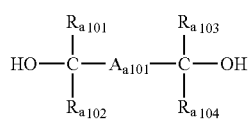

(FAD-I)

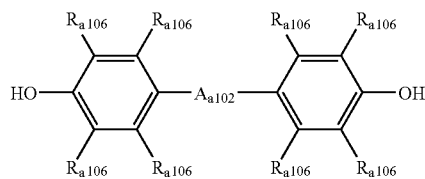

(FAD-III)

wherein $R_{a101}$, $R_{a102}$, $R_{a103}$ and $R_{a104}$ each represents a hydrogen atom, an alkyl group, an alicylic alkyl group, an alkoxyl group, an acyl group or an acyloxy group;

$A_{a101}$ represents a perfluoroalkylene group or a perfluorocycloalkylene group;

$A_{a102}$ represents a single bond or a divalent organic group; and $R_{a106}$ represents a fluorine atom or a perfluoroalkyl group, in which a plurality of $R_{a106}$ each may be the same or different.

2. The chemical amplification resist composition as claimed in claim 1, wherein the compound (Ca) is a compound represented by the following formula (FAD-Ia):

$$HO-CH_2-A_{a101}-CH_2-OH \quad \text{(FAD-Ia)}$$

wherein $A_{a101}$ represents a perfluoroalkylene group or a perfluorocycloalkylene group.

3. The chemical amplification resist composition as claimed in claim 1, wherein the content of the component (C) in the solids content of the chemical amplification resist composition is from 0.1 to 10 mass %.

4. The chemical amplification resist composition as claimed in claim 1, wherein the resin (A) has at least one repeating unit selected from the group consisting of a repeating unit having a partial structure containing alicyclic hydrocarbon represented by the following formula (pI), (pII), (pIII), (pIV), (pV) or (pVI), and a repeating unit represented by the following formula (II-AB):

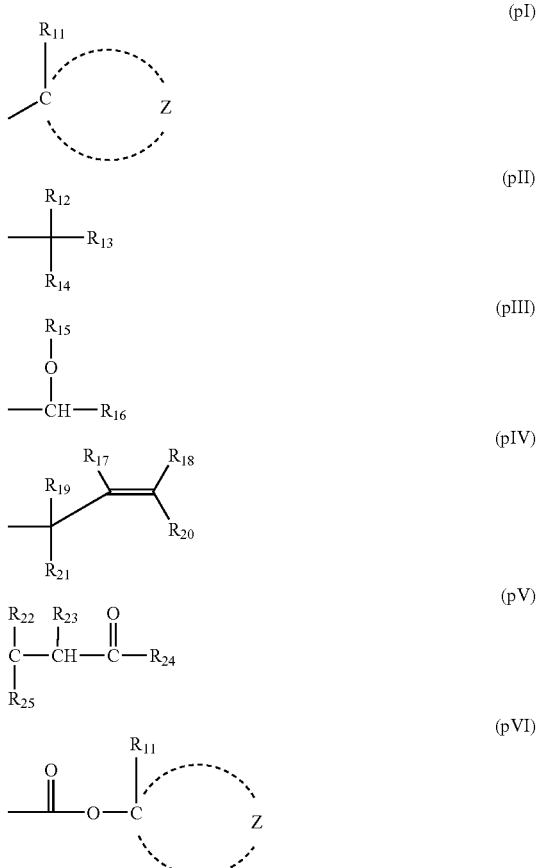

wherein $R_{11}$ represents an alkyl group; Z represents an atomic group necessary to form an alicyclic hydrocarbon group together with a carbon atom;

$R_{12}$, $R_{13}$, $R_{14}$, $R_{15}$ and $R_{16}$ each represents an alkyl group or an alicyclic hydrocarbon group, provided that at least one of $R_{12}$ to $R_{14}$, or either $R_{15}$ or $R_{16}$, represents an alicyclic hydrocarbon group;

$R_{17}$, $R_{18}$, $R_{19}$, $R_{20}$ and $R_{21}$ each represents a hydrogen atom, an alkyl group or an alicyclic hydrocarbon group, provided that at least one of $R_{17}$ to $R_{21}$ represents an alicyclic hydrocarbon group, and either $R_{19}$ or $R_{21}$ represents an alkyl group or an alicyclic hydrocarbon group;

$R_{22}$, $R_{23}$, $R_{24}$ and $R_{25}$ each represents an alkyl group or an alicyclic hydrocarbon group, provided that at least one of $R_{22}$ to $R_{25}$ represents an alicyclic hydrocarbon group, and $R_{23}$ and $R_{24}$ may be bonded to each other to form a ring;

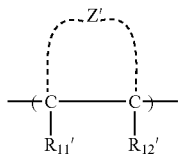

(II-AB)

wherein $R_{11}{'}$ and $R_{12}{'}$ each represents a hydrogen atom, a cyano group, a halogen atom or an alkyl group; and Z' represents an atomic group to form an alicyclic structure together with the bonded two carbon atoms (C—C).

5. The chemical amplification resist composition as claimed in claim 1, wherein the solvent (D) is a single solvent of alkyl lactate or propylene glycol monoalkyl ether carboxylate, or a mixed solvent containing at least two solvents selected from the group consisting of propylene glycol monoalkyl ether carboxylate, propylene glycol monoalkyl ether, cyclohexanone, and alkyl lactate.

6. The chemical amplification resist composition as claimed in claim 1, which further contains a nitrogen-containing basic compound.

7. The chemical amplification resist composition as claimed in claim 1, which further contains a surfactant containing at least one of a fluorine atom and a silicon atom.

8. A pattern-forming method comprising; forming a resist film with the chemical amplification resist composition as claimed in claim 1; and exposing and developing the resist film.

* * * * *